(12) United States Patent
Li et al.

(10) Patent No.: US 10,686,436 B2
(45) Date of Patent: Jun. 16, 2020

(54) GATE DRIVERS AND VOLTAGE REGULATORS FOR GALLIUM NITRIDE DEVICES AND INTEGRATED CIRCUITS

(71) Applicants: Zhanming Li, West Vancouver (CA); Yue Fu, Coquitlam (CA); Yan-Fei Liu, Kingston (CA)

(72) Inventors: Zhanming Li, West Vancouver (CA); Yue Fu, Coquitlam (CA); Yan-Fei Liu, Kingston (CA)

( * ) Notice: Subject to any disclaimer, the term of this patent is extended or adjusted under 35 U.S.C. 154(b) by 0 days.

(21) Appl. No.: 16/454,078

(22) Filed: Jun. 27, 2019

(65) Prior Publication Data

US 2020/0007119 A1    Jan. 2, 2020

Related U.S. Application Data

(63) Continuation-in-part of application No. 16/449,356, filed on Jun. 22, 2019.

(60) Provisional application No. 62/690,378, filed on Jun. 27, 2018, provisional application No. 62/694,663, filed on Jul. 6, 2018.

(51) Int. Cl.
| | |
|---|---|
| *H03F 1/30* | (2006.01) |
| *H03K 17/06* | (2006.01) |
| *H01L 29/20* | (2006.01) |
| *H01L 29/778* | (2006.01) |
| *H01L 27/06* | (2006.01) |
| *H02M 1/08* | (2006.01) |
| *H03K 17/081* | (2006.01) |
| *H01L 27/02* | (2006.01) |
| *H02M 3/335* | (2006.01) |

(52) U.S. Cl.
CPC ....... *H03K 17/063* (2013.01); *H01L 27/0207* (2013.01); *H01L 27/0605* (2013.01); *H01L 27/0629* (2013.01); *H01L 29/2003* (2013.01); *H01L 29/7786* (2013.01); *H02M 1/08* (2013.01); *H02M 3/33592* (2013.01); *H03K 17/08104* (2013.01)

(58) Field of Classification Search
CPC ................. H03F 1/30; H03F 3/20; H03G 3/30
USPC .................................................. 330/296, 285
See application file for complete search history.

(56) References Cited

U.S. PATENT DOCUMENTS

| | | | | |
|---|---|---|---|---|
| 4,767,946 A | * | 8/1988 | Taylor ....................... | G05F 3/22 327/333 |
| 7,355,480 B2 | * | 4/2008 | Honda ...................... | H03F 1/30 330/285 |

(Continued)

*Primary Examiner* — Henry Choe

(57) ABSTRACT

Voltage stabilizing and voltage regulating circuits implemented in GaN HEMT technology provide stable output voltages suitable for use in applications such as GaN power transistor gate drivers and low voltage auxiliary power supplies for GaN integrated circuits. Gate driver and voltage regulator modules include at least one GaN D-mode HEMT (DHEMT) and at least two GaN E-mode HEMTs (EHEMTs) connected together in series, so that the at least one DHEMT operates as a variable resistor and the at least two EHEMTs operate as a Zener diode that limits the output voltage. The gate driver and voltage regulator modules may be implemented as a GaN integrated circuits, and may be monolithically integrated together with other components such as amplifiers and power HEMTs on a single die to provide a GaN HEMT power module IC.

20 Claims, 26 Drawing Sheets

(56) References Cited

U.S. PATENT DOCUMENTS

| | | | |
|---|---|---|---|
| 7,898,339 B2* | 3/2011 | Ikeda | H03F 1/223 330/285 |
| 2001/0040482 A1* | 11/2001 | Dening | H03F 1/302 330/296 |

* cited by examiner

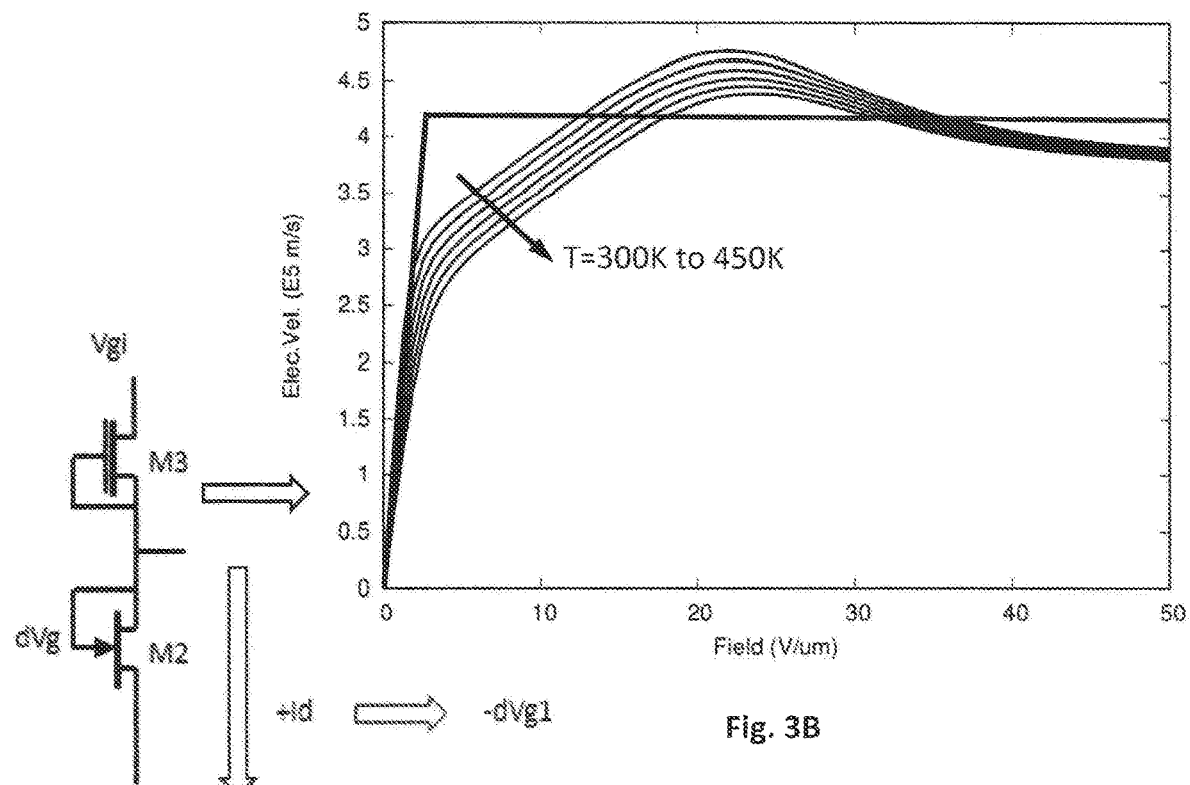
Fig. 3A
Fig. 3B
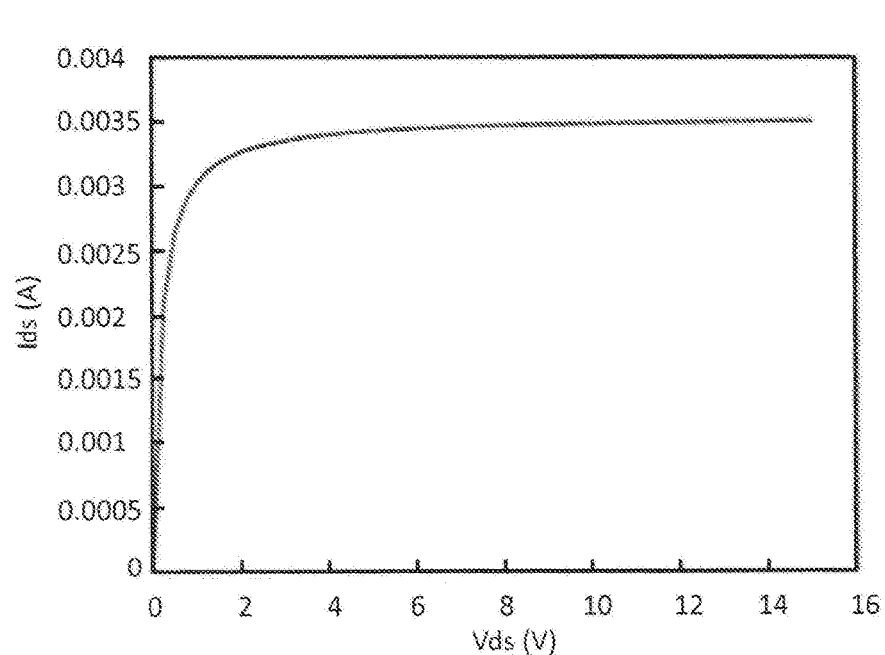
Fig. 3C

GATE DRIVERS AND VOLTAGE REGULATORS FOR GALLIUM NITRIDE DEVICES AND INTEGRATED CIRCUITS

RELATED APPLICATIONS

This application claims the benefit of the filing date of Application No. 62/690,378, filed on Jun. 27, 2018, Application No. 62/694,663, filed on Jul. 6, 2018, and application Ser. No. 16/449,356, filed on Jun. 22, 2019, the contents of which are incorporated herein by reference in their entirety.

FIELD

This invention relates generally to gallium nitride (GaN) based power electronic devices and integrated circuits. More specifically, the invention relates to gate drivers and voltage regulators for GaN power transistors and devices, and implementations on GaN integrated circuits.

BACKGROUND

Wide bandgap (WBG) gallium nitride (GaN) based power electronic devices are gaining importance as next generation high-efficiency power devices owing to superior material properties such as high electric breakdown field, high electron saturation velocity, and high electron mobility in a readily available heterojunction 2-D electron gas (2DEG) channel. With this technology it is possible to achieve much higher power density as well as efficiency for power electronic devices.

At present, available GaN platforms include GaN on silicon, GaN on sapphire, and GaN on GaN. Regardless the substrate material used, a common challenge is the mismatch of the gate driving voltage, being much lower than its silicon counterpart, making it difficult to directly replace silicon MOSFETs or IGBTs in existing power electronic systems. A lower gate driving voltage makes GaN devices less immune to driving voltage noise and thus reduces system reliability.

One common solution for overcoming this mismatch is to use low voltage MOSFETs as the front end in a cascode configuration. However, such an approach suffers from mismatch of channel leakage currents between the two different transistors, which degrades the reliability and performance of such cascoded devices compared to high electron mobility transistor (HEMT) counterparts.

SUMMARY

One aspect of the invention relates to a gate driver circuit for a gallium nitride (GaN) power high electron mobility transistor (HEMT), comprising: an input point that receives an input voltage and an output point that outputs an output voltage to drive the power HEMT; a series circuit comprising at least one GaN D-mode HEMT (DHEMT) and at least first and second GaN E-mode HEMTs (EHEMTs); wherein: a drain of the DHEMT is connect to the input point and a source of the DHEMT is connected to a drain of the first EHEMT and to the output point; a gate of the DHEMT is connected to the source of the DHEMT; a source of the first EHEMT is connected to a drain of the second EHEMT; a gate of the first EHEMT is connected to the drain of the first EHEMT; a source of the second EHEMT is connected to a circuit common; and a gate of the second EHEMT is connected to the drain of the second EHEMT.

In one embodiment the gate driver circuit provides voltage down-shifting and over-voltage protection to drive the GaN power HEMT.

In one embodiment the at least one DHEMT operates as a variable resistor and the at least first and second EHEMTs operate as a zener diode that limits the output voltage to about 6 V.

In one embodiment the DHEMT and the at least first and second EHEMTs are low voltage devices.

In one embodiment the DHEMT and the at least first and second EHEMTs have different channel lengths and/or different channel widths.

In one embodiment the DHEMT and the at least first and second EHEMTs have the same channel lengths.

In one embodiment the DHEMT has a channel width that is 17 to 25 percent of the channel width of a smallest of the at least first and second EHEMTs.

In one embodiment the channel widths of the at least first and second EHEMTs are the same, and a ratio of channel widths of the DHEMT:EHEMTs is about 1:4.7.

Another aspect of the invention relates to a GaN integrated circuit (IC) power module, comprising: a gate driver circuit as described herein; and a power HEMT; wherein the gate driver module and the power HEMT are monolithically integrated in a single die.

In one embodiment the GaN power module power HEMT comprises at least first and second high voltage HEMTs connected together in parallel; the first high voltage HEMT is smaller than the second high voltage HEMT so that an area of the die is not occupied by the power HEMT; and the gate driver module is disposed in the area of the die that is not occupied by the power HEMT.

Another aspect of the invention relates to a method for implementing a gate driver circuit for a GaN power HEMT, comprising: providing an input point that receives an input voltage and an output point that outputs an output voltage to drive the power HEMT; connecting at least one GaN DHEMT and at least first and second GaN EHEMTs together in series; wherein: a drain of the DHEMT is connect to the input point and a source of the DHEMT is connected to a drain of the first EHEMT and to the output point; a gate of the DHEMT is connected to the source of the DHEMT; a source of the first EHEMT is connected to a drain of the second EHEMT; a gate of the first EHEMT is connected to the drain of the first EHEMT; a source of the second EHEMT is connected to a circuit common; and a gate of the second EHEMT is connected to the drain of the second EHEMT; wherein a gate driver circuit for a GaN power HEMT is provided.

In one embodiment the method comprises monolithically integrating the gate driver together with the power HEMT in a single GaN die. In one embodiment the power HEMT is implemented using at least first and second high voltage HEMTs connected together in parallel; wherein the first high voltage HEMT is smaller than the second high voltage HEMT so that an area of the die is not occupied by the power HEMT; and the gate driver module is disposed in the area of the die that is not occupied by the power HEMT.

Another aspect of the invention relates to a voltage regulator circuit for a GaN device, comprising: an input point that receives an input voltage and an output point that outputs an output voltage for the GaN device; a series circuit comprising at least one GaN D-mode HEMT (DHEMT) with gate-to-source connection and at least first to fourth GaN E-mode HEMTs (EHEMTs) each with drain-to-gate connection; an output EHEMT having a drain connected to the input point and a source connected to the output point;

wherein: a drain of the DHEMT is connected to the input point and a source of the DHEMT is connected to a drain of the first EHEMT and to a gate of the output EHEMT; a source of the first EHEMT is connected to a drain of the second EHEMT, a source of the second EHEMT is connected to a drain of the third EHEMT, a source of the third EHEMT is connected to a drain of the fourth EHEMT, and a source of the fourth EHEMT is connected to a circuit common.

In one embodiment the voltage regulator circuit provides a reference voltage output.

In one embodiment the GaN device comprises an amplifier.

In one embodiment the at least one DHEMT operates as a variable resistor and the at least first to fourth EHEMTs operate as a Zener diode that limits the output voltage to about 6 V.

In one embodiment the DHEMT and the at least first to fourth EHEMTs are low voltage devices.

In one embodiment the DHEMT and the at least first to fourth EHEMTs have different channel lengths and/or different channel widths.

In one embodiment the DHEMT has a channel width that is about 2 to about 20 percent of the channel width of a smallest of the at least first to fourth EHEMTs.

In one embodiment, channel widths of the at least first to fourth EHEMTs are the same.

Another aspect of the invention relates to a GaN integrated circuit power module, comprising: a voltage regulator circuit as described herein; an amplifier; and a power HEMT; wherein the voltage regulator circuit, the amplifier, and the power HEMT are monolithically integrated in a single die.

In one embodiment, the GaN IC power module power HEMT comprises at least first and second high voltage HEMTs connected together in parallel; wherein the first high voltage HEMT is smaller than the second high voltage HEMT so that an area of the die is not occupied by the power HEMT; and the voltage regulator circuit and the amplifier are disposed in the area of the die that is not occupied by the power HEMT.

Another aspect of the invention relates to a method for implementing a voltage regulator circuit for a GaN device, comprising: providing an input point that receives an input voltage and an output point that outputs an output voltage to drive the GaN device; connecting at least one GaN D-mode HEMT (DHEMT) with gate-to-source connection in series with at least first to fourth GaN E-mode HEMTs (EHEMTs) each with drain-to-gate connection; connecting a drain of an output EHEMT to the input point and a source of the output HEMT to the output point; wherein: a drain of the DHEMT is connected to the input point and a source of the DHEMT is connected to a drain of the first EHEMT and to a gate of the output EHEMT; a source of the first EHEMT is connected to a drain of the second EHEMT, a source of the second EHEMT is connected to a drain of the third EHEMT, a source of the third EHEMT is connected to a drain of the fourth EHEMT, and a source of the fourth EHEMT is connected to a circuit common; wherein a voltage regulator circuit for a GaN device is provided.

In one embodiment the method comprises monolithically integrating the voltage regulator circuit together with an amplifier and a power HEMT; wherein the voltage regulator circuit, the amplifier, and the power HEMT are monolithically integrated in a single die.

In one embodiment the method comprises: implementing the power HEMT with at least first and second high voltage HEMTs connected together in parallel; wherein the first high voltage HEMT is smaller than the second high voltage HEMT so that an area of the die is not occupied by the power HEMT; and the voltage regulator circuit and the amplifier are disposed in the area of the die that is not occupied by the power HEMT.

Another aspect of the invention relates to a GaN based gate-input integrated circuit consisting of two to four EHEMTs and one DHEMT connected in series (source to drain) connected such that the gate of the EHEMT is connected to the drain electrode; the gate of the DHEMT is connected to the source electrode; the input of the IC is the drain of the DHEMT; and the output of the IC is the source of the DHEMT. The output may be used as a gate driver for at least one GaN power transistor.

In one embodiment the DHEMT is monolithically integrated with multiple EHEMTs of different channel lengths and widths, and all components have lower voltage rating than the power transistor(s).

In one embodiment the DHEMT is integrated with the EHEMTs using the same technology with the same channel length while the DHEMT channel width is about 17 to about 25 percent of that of the smallest EHEMT.

In one embodiment the EHEMTs are implemented in a two-metal design having the following arrangements: a gate Metal2 is placed parallel to the EHEMT gate fingers; the gate Metal2 is positioned on the sides next to the drain electrode (gate side-bar); and a short Metal2 plate connects the side-bar and the drain electrode.

In one embodiment the main power transistor and the gate-input IC are arranged such that the main power transistor comprises two power transistors connected in parallel and fingers of the two power transistors are parallel; the fingers of one of the power transistors are shorter than the those of other; one edge of the shorter power transistor is aligned with an edge of the longer power transistor while another edge of the shorter power transistor defines a rectangular wafer space on the die; the source and drain arrangement of the two power transistors is such that the rectangular wafer space of the die is surrounded by the source electrode of the two power transistors; the gate input driver multiple transistors (DHEMT and EHEMTs) connected in series are disposed within the rectangular wafer space.

In one embodiment the DHEMT of the gate input IC is asymmetric with the drain being larger to accommodate a wire bonding pad or a land grid array (LGA) or ball grid array (BGA) metal bump.

Another aspect of the invention relates to a GaN based auxiliary voltage regulator integrated circuit including four to six EHEMTs connected in series with one DHEMT (source to drain) and one larger size EHEMT in parallel with the DHEMT, and with a connection such that the gate of a smaller EHEMT is connected to the drain electrode; the gate of the DHEMT is connected to source electrode; a larger EHEMT has its gate connected to the source of the DHEMT and its drain connected to drain of the DHEMT; wherein the input of the IC is the drain of the DHEMT; and the output of the IC is the source of the larger EHEMT.

In one embodiment the DHEMT is monolithically integrated with multiple EHEMTs of different channel lengths and widths, and the larger EHEMT is the largest in width, and all IC components have lower voltage rating than a main power transistor(s).

In one embodiment the EHEMTs and the DHEMT are integrated using the same technology with the same channel length while the DHEMT channel width is about 2 to about 20 percent of that of the smallest EHEMT.

In one embodiment the smaller EHEMTs have an arrangement such that their gate fingers are parallel with all finger tips aligned to form a single column (or row); each EHEMT has a source and drain flipped (i.e., alternating sides) relative to adjacent EHEMTs; and the source and drain electrodes of each EHEMT are connected using Metal2 layer to the opposite electrode of its adjacent EHEMT.

In one embodiment, an output EHEMT is larger and is arranged such that its gate fingers are perpendicular to the smaller EHEMTs and its smaller dimension is the same as an array width of the smaller EHEMTs, such that the complete regulator layout forms a rectangular block.

In one embodiment the main power transistor and the regulator rectangular block are arranged such that the main power transistor comprises two power transistors connected in parallel; wherein fingers of the two power transistors are parallel; the fingers of one power transistor are shorter than those of the other; one edge of the shorter power transistor is aligned with an edge of the longer power transistor while the another edge of the shorter power transistor defines a rectangular space on the wafer die; wherein the source and drain arrangement of the two power transistors are such that the rectangular space is surrounded by the source electrode of the two power transistors; wherein the four to six EHEMTs and the DHEMT of the voltage rectangle block are placed on the outer edge of the rectangular space.

Another aspect of the invention relates to a gate driver circuit for a gallium nitride (GaN) power transistor, comprising: an input point that receives an input voltage and an output point that outputs an output voltage to drive the GaN power transistor; a series circuit comprising at least one GaN D-mode HEMT (DHEMT) with gate-to-source connection and at least first to fourth GaN E-mode HEMTs (EHEMTs) each with drain-to-gate connection; an output EHEMT having a drain connected to the input point and a source connected to the output point; wherein a drain of the DHEMT is connected to the input point and a source of the DHEMT is connected to a drain of the first EHEMT and to a gate of the output EHEMT; wherein a source of the first EHEMT is connected to a drain of the second EHEMT, a source of the second EHEMT is connected to a drain of the third EHEMT, a source of the third EHEMT is connected to a drain of the fourth EHEMT, and a source of the fourth EHEMT is connected to a circuit common.

In one embodiment, the output EHEMT comprises a source follower amplifier.

In one embodiment, the gate driver circuit further comprises an amplifier; wherein the output point is connected to an input of the amplifier; wherein an output of the amplifier drives the GaN power transistor.

In one embodiment, the amplifier input comprises a bootstrap configuration. The bootstrap configuration may include a diode connected in series between the output point and the amplifier input, and a capacitor connected between the amplifier input and the circuit common.

In one embodiment, the amplifier comprises a direct coupled FET logic (DCFL) amplifier.

In various embodiments, the gate driver circuit may comprise a GaN power transistor; wherein the GaN power transistor is self-driven.

Embodiments of the gate driver circuit may be implemented in GaN integrated circuit technology. Embodiments may be implemented in GaN integrated circuit technology according to methods and techniques described herein.

Another aspect of the invention relates to a power converter comprising one or more GaN power switches; wherein at least one GaN power switch comprises a gate driver circuit as described herein, wherein the GaN power switch is self-driven. The GaN power switch may be a synchronous rectifier of a power converter.

Another aspect of the invention relates to methods for gate drivers for a gallium nitride (GaN) power transistor as described herein. The methods may include implementations in GaN integrated circuit technology, and implementations in power converters wherein one or more GaN power switch of a power converter is self-driven.

BRIEF DESCRIPTION OF THE DRAWINGS

For a better understanding of the invention, and to show more clearly how it may be carried into effect, embodiments will be described, by way of example, with reference to the accompanying drawings, wherein:

FIG. 3A is a schematic diagram illustrating how an increase in drain current can cause a negative voltage feedback which is used to stabilize the gate voltage for a GaN power transistor.

FIG. 3B is a plot showing electron velocity versus field of a D-mode high electron mobility transistor (DHEMT) channel.

FIG. 3C is a plot showing the drain current-voltage characteristic of the DHEMT M3 at zero gate voltage.

DETAILED DESCRIPTION OF EMBODIMENTS

A drawback of prior GaN power transistor gate drivers based on silicon devices is mismatch of gate driving voltages and channel leakage currents between the two different transistor technologies, which degrades reliability and performance. For example, the gate driving voltage for silicon-based power electronic devices typically ranges from 10 to 15 volts. In contrast, the gate driving voltage for GaN HEMTs is much lower, ranging from 3 to 6 volts. One aspect of this invention relates to voltage stabilizing and/or regulating circuits implemented in GaN HEMT technology that provide stable output voltages suitable for use in applications such as GaN power transistor gate drivers and low voltage auxiliary power supplies for GaN devices, circuits, etc., including GaN integrated circuits, that avoid such mismatches. Embodiments may thus advantageously exploit the 2DEG property of GaN HEMTs. Embodiments described herein may be implemented using GaN discrete components, or they may be partially or completely implemented in GaN integrated circuit technology, with low wafer area cost. As an example, embodiments may be implemented in a 650 V GaN-on-silicon process. Emode may be achieved using a p-GaN layer, however, the invention is not limited thereto as embodiments in Emode may also be achieved using other techniques. Gate driver embodiments may be designed according to guidelines of 100 V rules, although any technology ranging from 30-100 V is suitable. A two-metal layer process may be used as described herein, although the invention is not limited thereto.

Figure 1:
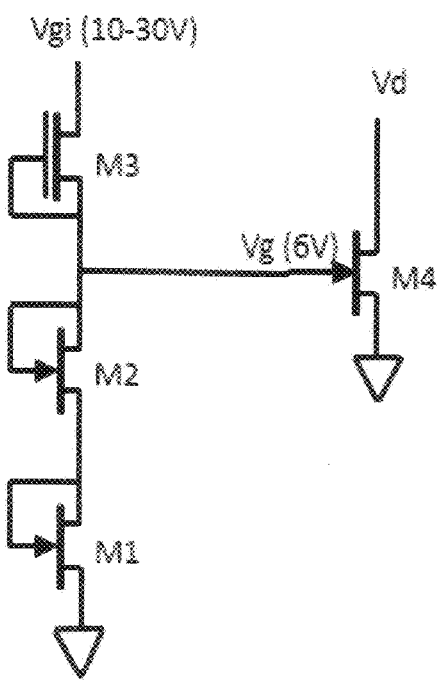
FIG. 1 is a schematic diagram showing a gate driving circuit for a GaN power transistor, according to one embodiment.

A gate driver module according to one embodiment is shown in the schematic diagram of FIG. 1, where M4 is the main power transistor, and M1, M2, and M3 are the gate driver module (also referred to as "gate input module") for M4. M4 is a high voltage (HV) EHEMT (such as, e.g., 650 V to 1200 V), M1 and M2 are two similar or identical low voltage (LV) EHEMTs (such as, e.g., 40 V to 100 V), and M3 is a LV DHEMT. M3 may use the same channel/gate feature as M1 and M2. In the embodiment of FIG. 1 the input driving voltage of the gate driver module Vgi is 10 V to 30 V and the gate voltage Vg of M4 is 6 V; however, other voltages are possible.

Figure 2:
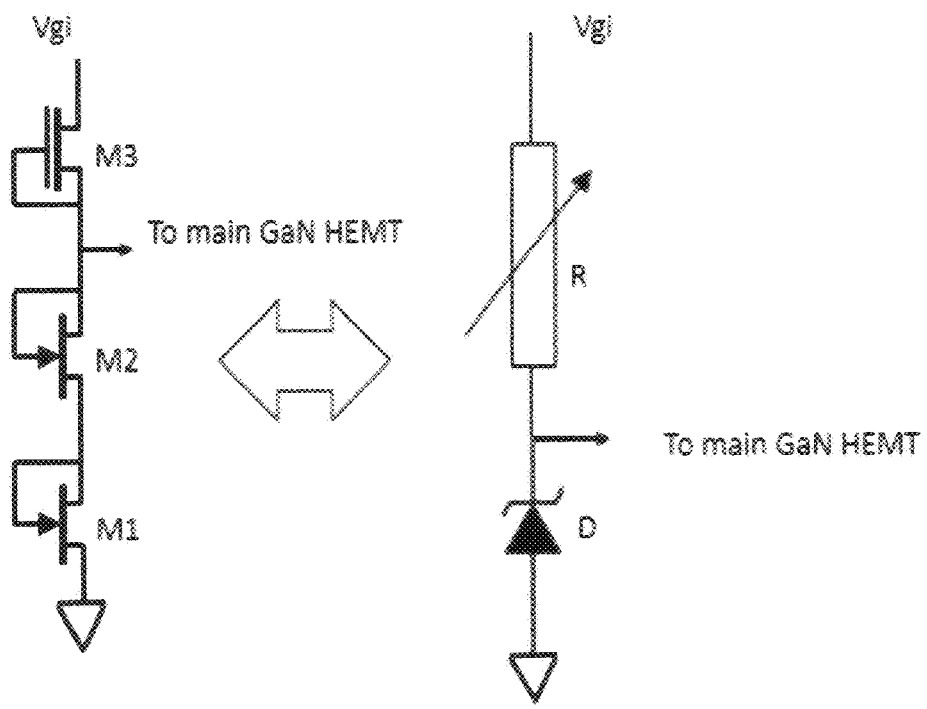
FIG. 2 is a schematic diagram showing an equivalent circuit of a voltage stabilizing circuit of the embodiment of FIG. 1.

In the embodiment of FIG. 1, the topology of M1, M2, and M3 provides voltage down-shifting and over-voltage protection to achieve the proper gate driving voltage for M4. The equivalent circuit of M1, M2, and M3 in the embodiment of FIG. 1 is illustrated in FIG. 2, where the DHEMT M3 can be regarded as a variable resistor R while the two EHEMTs M1 and M2 can be regarded as a voltage stabilizing Zener diode D, which limits the output voltage to the gate of M4 to, e.g., about 6 V.

An advantage of the embodiment of FIG. 1 may be explained by considering the electron velocity (proportional to electron current in the DHEMT channel), as plotted in FIG. 3B. The electron saturation behavior exhibits negative differential resistance, in theory (Turin, V. O., A modified transferred-electron high-field mobility model for GaN device simulation. Solid-State Electronics 49:1678-1682, 2005). Due to various channel scattering mechanisms and for low frequency to DC measurements, the negative resistance is not obtained. Therefore, the usual practice is to model the electron velocity characteristics as a flat line (as indicated in the plot in FIG. 3B). The flat line means the resistance of the DHEMT is variable. At higher bias the resistance is higher, thus reducing the voltage stress for the gate of the main EHEMT M4.

A benefit of using a DHEMT for M3 is also indicated in electron velocity versus field plot (the plot of FIG. 3B) which shows low resistance at low field or low voltage. This is important since turning off the main transistor results in a bottleneck in many prior topologies. The high electron mobility at low electric field (high initial slope in FIG. 3B) makes the DHEMT a good discharging resistor for the main EHEMT M4. This may enable a fast and clean turn off for the main power transistor M4. FIG. 3C shows the drain current-voltage characteristic of the DHEMT M3 at zero gate voltage.

The EHEMTs M1 and M2 are configured in a unique connection arrangement with gate-drain shortage. Such a configuration effectively sets up a negative voltage feedback loop as follows. An increase dVg at the drain/gate (shorted) is amplified into an increase in drain current+Id (see FIG. 3A). The increase in drain current enhances the voltage drop on the load and thus reduces dVg (which is shown as "–dVg1" in FIG. 3A) and this completes the negative feedback.

It is clear from the analysis related to FIG. 3A that +Id is additive when more LV EHEMTs are used in series. An ideal embodiment would be to use as many LV EHEMTs as possible for the purpose of voltage stabilization. However, the limit on the number of LV EHEMTs is set by the maximum Vg of the main power EHEMT. which is typically 6 V for GaN technology based on p-GaN fabrication. Assuming a common threshold gate voltage (Vt) of 1.5-2 V, and given that about 1 V above threshold voltage is necessary to bias the LV EHEMT in a proper signal amplification mode, only two LV EHEMTs can be used. However, should the Vt be lowered to 1 V or less, three to four LV EHEMTs may be used.

Figure 4:
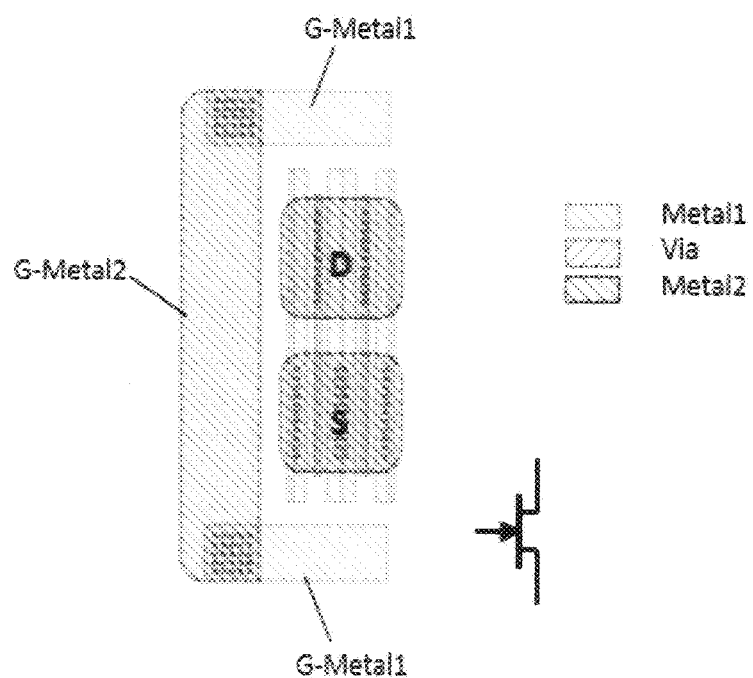
FIG. 4 is a diagram showing a layout for an E-mode HEMT using two metal layers (Metal1 and Metal2), according to the prior art.

Implementation of the embodiment of FIG. 1 using GaN integrated circuit technology will now be described. A common two metal-layer technology EHEMT layout is shown in FIG. 4. The legend shows various layers of the fabrication process, wherein Metal1 and Metal2 are the two top metal layers above the device, used for making electrodes, and Via is an opening through the insulating layers between Metal1 and Metal2 layers which is filled with metal for the purpose connecting Metal1 and Metal2. The legend is the same for FIGS. 5-10, 18-21, and 24-26, although in FIGS. 8-10, 19, and 24-26 pad-opening is an opening of the top protective coating through which electrode contacts are made. In these figures, G, D, and S refer to gate, drain, and source, respectively. The gate metal can be accessed through two metal layers (Metal1 and Metal2, connected through a VIA). The source and drain can only be accessed using Metal2.

Figure 5:
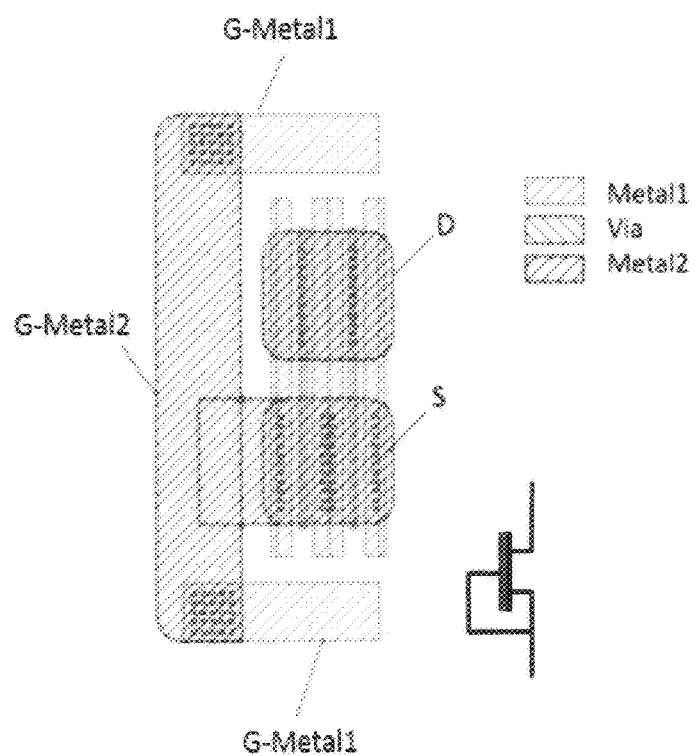
FIG. 5 is a diagram showing a layout for a Dmode HEMT using two metal layers (Metal1 and Metal2) with the source and gate shorted, according to one embodiment.

A two metal-layer technology DHEMT layout is shown in FIG. 5, where the gate is shorted to the source for the purpose of providing a stable bias for the conduction channel. Device fabrication is carried out so as to achieve natural Dmode for the HEMT.

Figure 6:
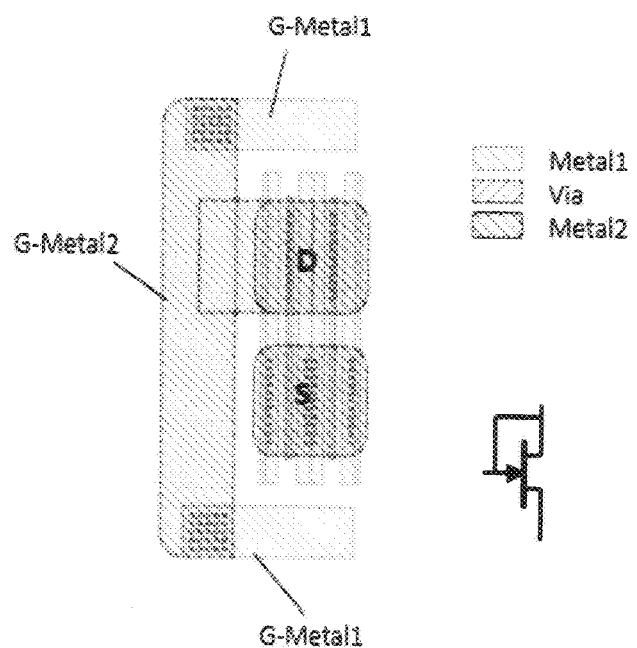
FIG. 6 is a diagram showing a layout for an Emode HEMT with the gate and drain shorted, according to one embodiment.

Referring to FIG. 1, the voltage stabilizing EHEMTs M1 and M2 were implemented most conveniently using a Metal2 connection from the drain to the gate side-bar, as indicated in FIG. 6. It is noted that the width ratio between LV DHEMT and LV EHEMT must be set carefully to achieve 6 V stabilized voltage, as described below.

For a power IC layout, placement of the gate driver module relative to the main power transistor is critical. Several considerations must be taken into account. Firstly, the module must be sufficiently close to the gate electrode of the main power transistor to reduce parasitic inductance. Secondly, the module must occupy as small an area as possible to reduce the wafer real estate cost. Thirdly, the module must be shielded from the high voltage drain pad to avoid electromagnetic interference.

Figure 7:
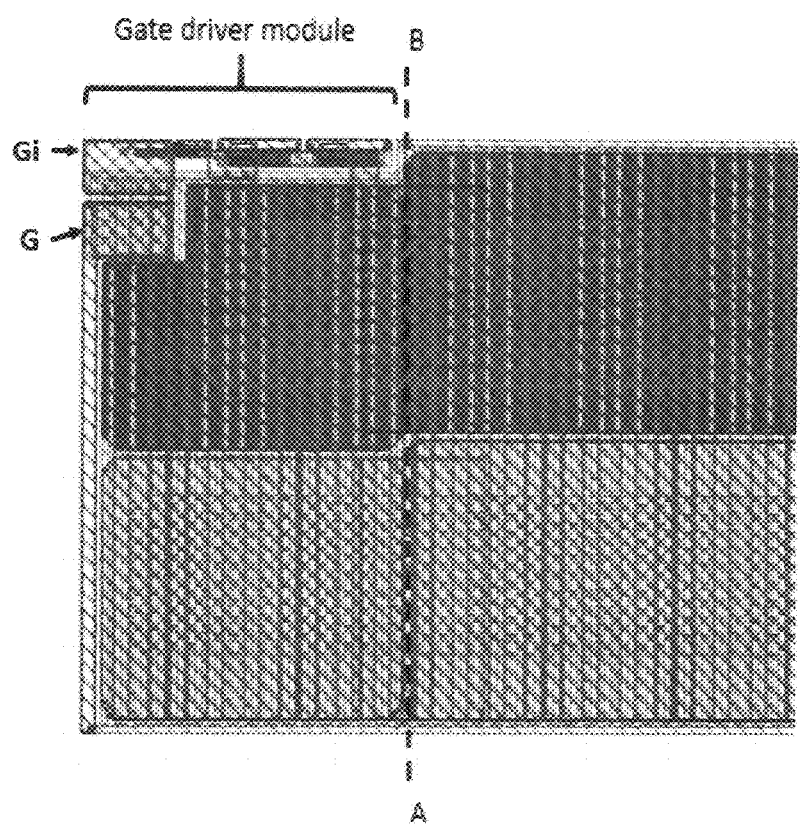
FIG. 7 is a diagram showing a layout for a gate input IC module near the source side of a main GaN power transistor, according to one embodiment.

In FIG. 7, which shows an embodiment of the power module IC layout, the gate driver module placement is shown in the upper left corner relative to the rest of the power module IC, which is the main GaN transistor M4 where the gate fingers are vertically oriented. To provide the wafer area for the gate drive module on the rectangular die, the main transistor is separated into two rectangular areas of paralleled EHEMTs, thus leaving out the small rectangular area of the required size for the gate driver module, as indicated in FIG. 7. Dashed line A-B separates the two rectangle-shaped main transistors connected in parallel as M4. It is noted that the gate driver module IC is close to both of the source sides of the two main transistors in parallel.

Figure 8:
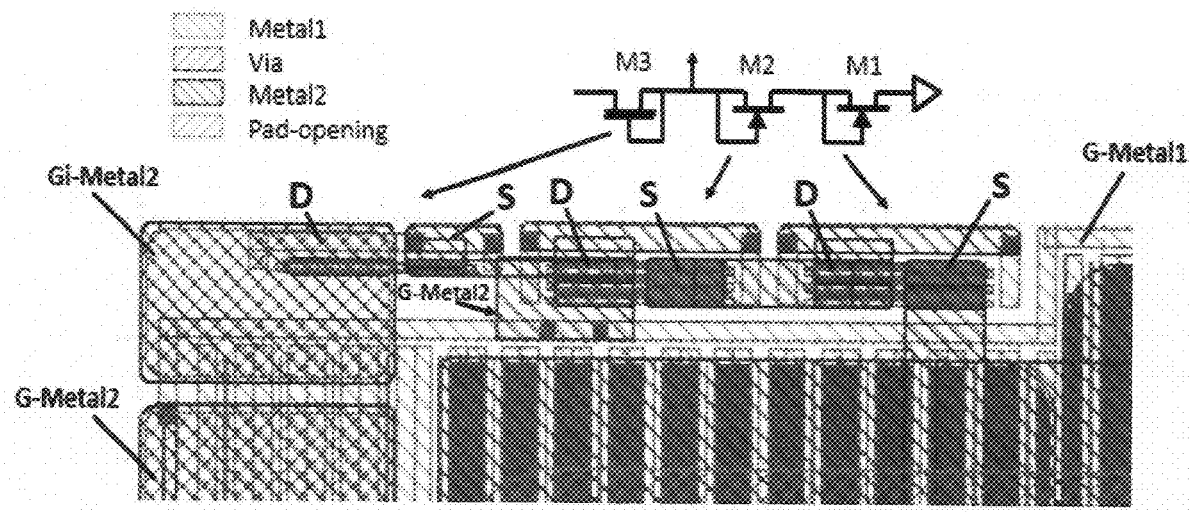
FIG. 8 is a diagram showing a detailed view of the layout of the gate input IC module near the source side of the main GaN power transistor of the embodiment of FIG. 7, wherein two high voltage main power transistors of rectangular shape are connected in parallel to accommodate the gate input IC.

FIG. 8 is a more detailed view of the layout of the gate driver module of the embodiment of FIG. 7. The output of the gate driver module is connected to the top gate rail which is on Metal1 layer (G-Metal1). The connection is through a VIA and the drain metal pad of EHEMT M2 which is the output point of the gate driver module. The Gi pad is the input to the module and it is on Metal2 layer, shown as Gi-Metal2, and it is necessary to make this pad large for ease of device packaging. The Gi pad is connected to the drain of the DHEMT M3 but isolated electrically from the rest of the devices.

Figure 9:
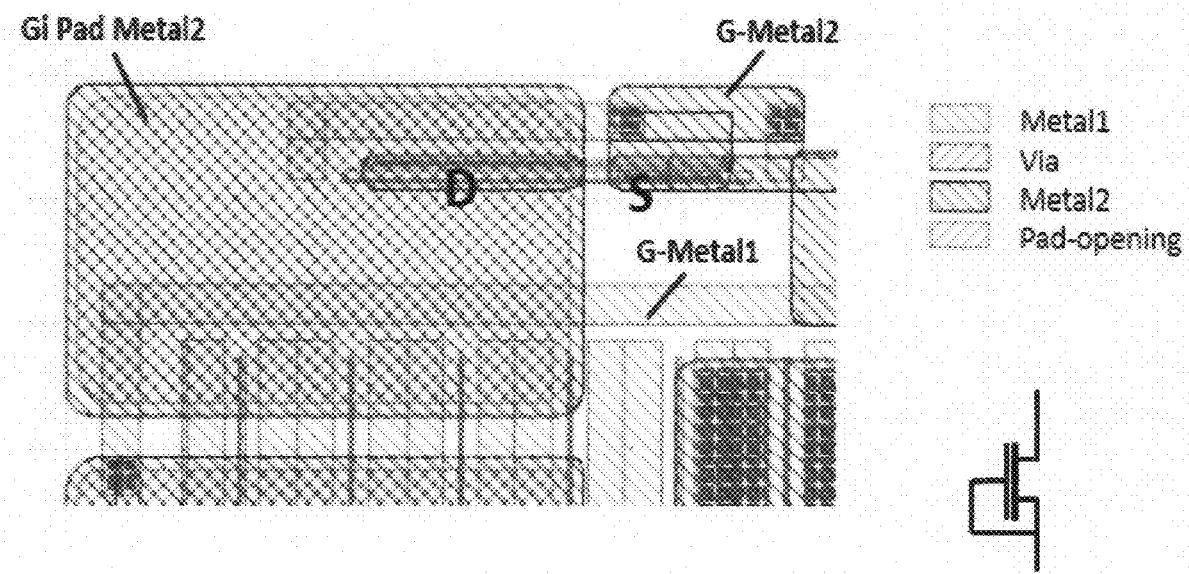
FIG. 9 is a diagram showing a detailed view of the layout of the DHEMT of the gate input IC module near the source side of the main GaN power transistor, according to one embodiment.

For wire bonding requirements, the Gi contact pad must be sufficiently large. Therefore, a unique design is used for the DHEMT M3, as shown in FIG. 9 which is a more detailed view of the layout of FIG. 8. To make the metal pad of Gi as large as possible, two techniques are used. The first is the upper part (or the left part when the layout of the series components of the gate driver module is oriented in the horizontal direction) of the Metal2 gate side-bar is removed to make way for the drain pad. The second is that the source and drain are implemented in an asymmetric arrangement such that the drain electrode is much larger than the source electrode. This way the drain pad can be of a size large enough for wire bonding or metal bumping.

For land grid array (LGA) or ball grid array (BGA) in a 650 V application, for example, it is necessary to separate the drain and source pads at a distance larger than about 2 mm. Therefore, in one embodiment the layout of the main transistor M4 is such that the gate fingers are parallel to the longer direction of the device while the source and drain are on the two ends of fingers. In another embodiment the gate fingers may be oriented in the horizontal and longer direction, as shown in FIG. 10.

Figure 10:
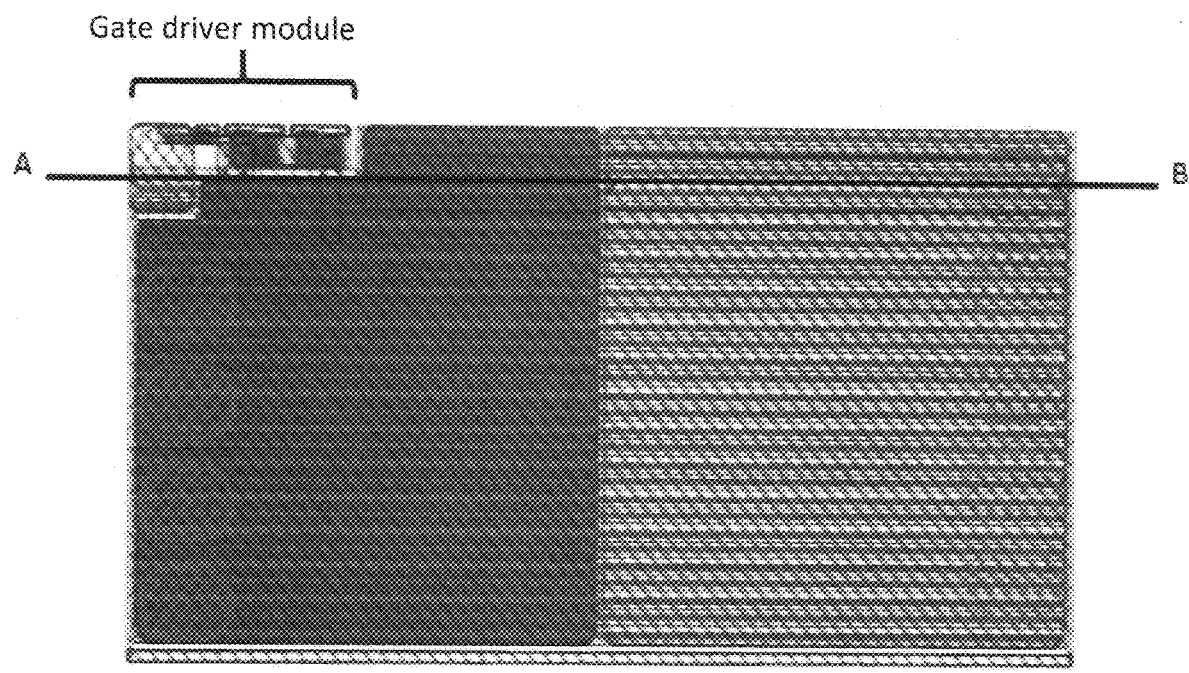
FIG. 10 is a diagram showing a detailed view of the layout of the gate input IC module near the source side of the main GaN power transistor according to one embodiment wherein gate metal bars of the main transistor are oriented in the horizontal direction.

To reserve space on the die for the gate input module, in one embodiment two parallel rectangular transistors are used for the main power transistor M4, separated by the horizontal line A-B as shown in the power module layout embodiments of FIGS. 7 and 10. In such an embodiment, the gate input module is located above the larger main transistor.

To implement embodiments as described herein, a 650V process may be used for the main transistor while for the low voltage EHEMTs and DHEMT a 100V process may be used, although other processes may also be used. It is important to design the ratio of the channel width of the DHEMT relative to those of the EHEMTs to ensure that a correct Vg will be achieved. For example, in embodiments where the two EHEMTs are identical and the DHEMT is of the same LV technology as the EHEMTs, the channel width ratio EHEMT:DHEMT in microns should be about 350μ:75μ, or about 4.7:1. Scaling by a constant factor of about the same order as unity (i.e., changing the ratio such as 2:1, 3:1, 8:1, 9:1, etc., where the first number is multiplied by a factor of 0.1 to 9 while the $2^{nd}$ number is always 1) will not alter the results but will affect resistance of the input gate module and thus affect the discharging/charging current magnitude.

Figure 11:
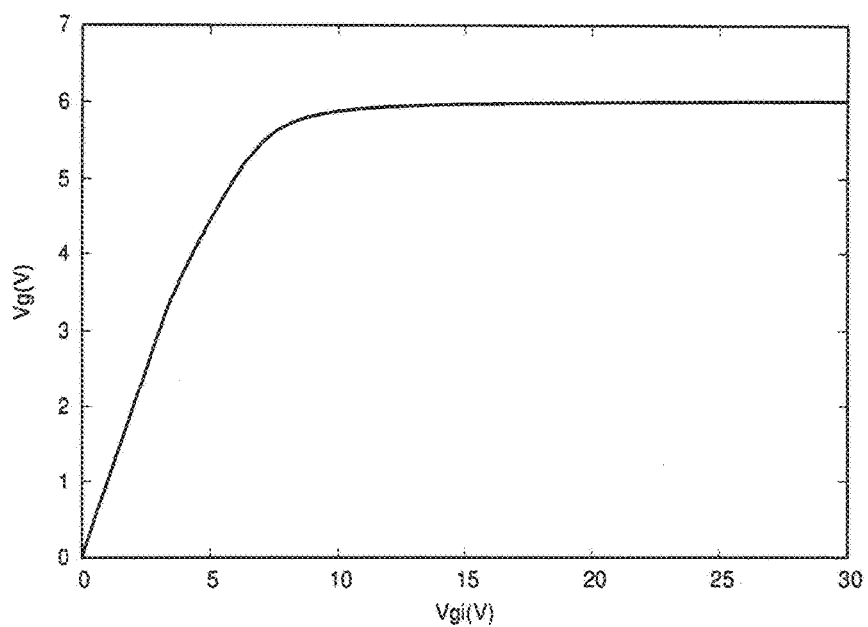
FIG. 11 is a plot showing a voltage transfer characteristic of gate driver modules according to two embodiments, obtained from a simulation.

A simulation was performed using APSYS™ software (Crosslight Software Inc., Vancouver, Canada; www.crosslight.com) to confirm operation of an embodiment based on the circuit of FIG. 1. In the simulation, two sizes were considered. Size1 refers to widths of EHEMT:DHEMT 350μ:75μ and Size2 was 7001μ:150μ. The results of Vg vs Vgi are shown in FIG. 11 and both sizes (Size1 and Size2) gave identical results for voltage down-shifting.

Figure 12:
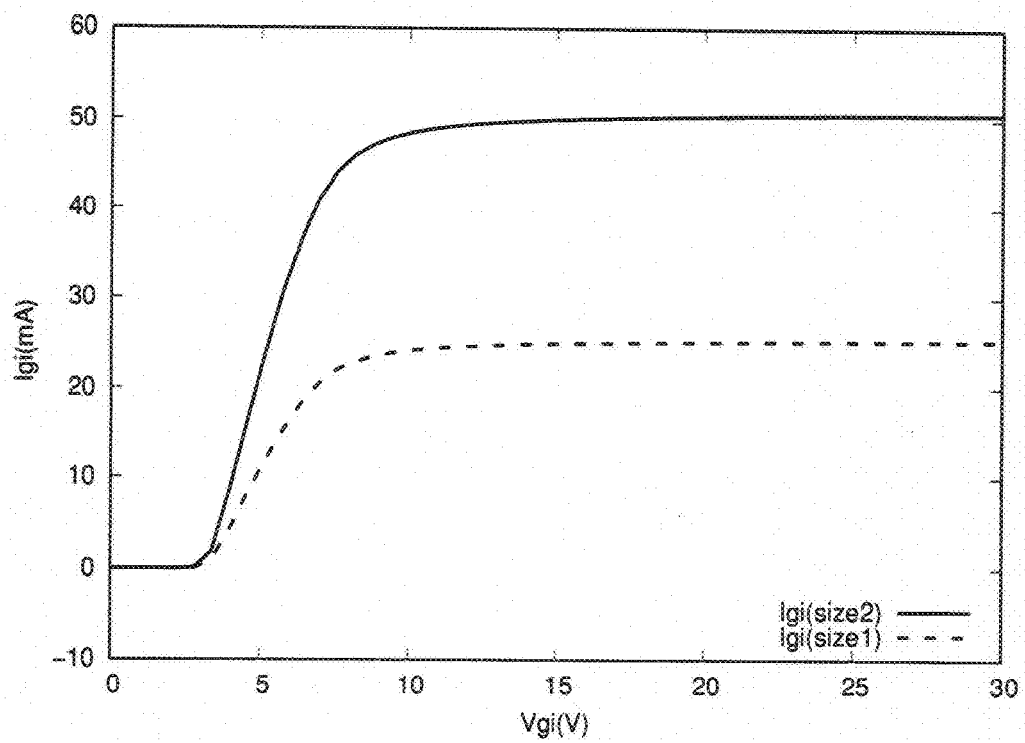
FIG. 12 is a plot showing current-voltage characteristics of gate driver modules according to two embodiments, obtained from a simulation.

The biasing current Igi of the gate driver module is sensitive to the device channel width. For the channel widths given above, the biasing current Igi is shown in FIG. 12. There is a trade off between discharging speed and DC power loss for the IC: a smaller channel width reduces the DC power loss but slows down the discharging of the main transistor M4. It is noted that the use of a gate driver module as described herein makes the power module (i.e., the gate driver module plus the power transistor M4 (e.g., two main HEMTs in parallel)) behave like a bipolar junction transistor (BJT) with a current amplification of 50-100.

Figure 13:
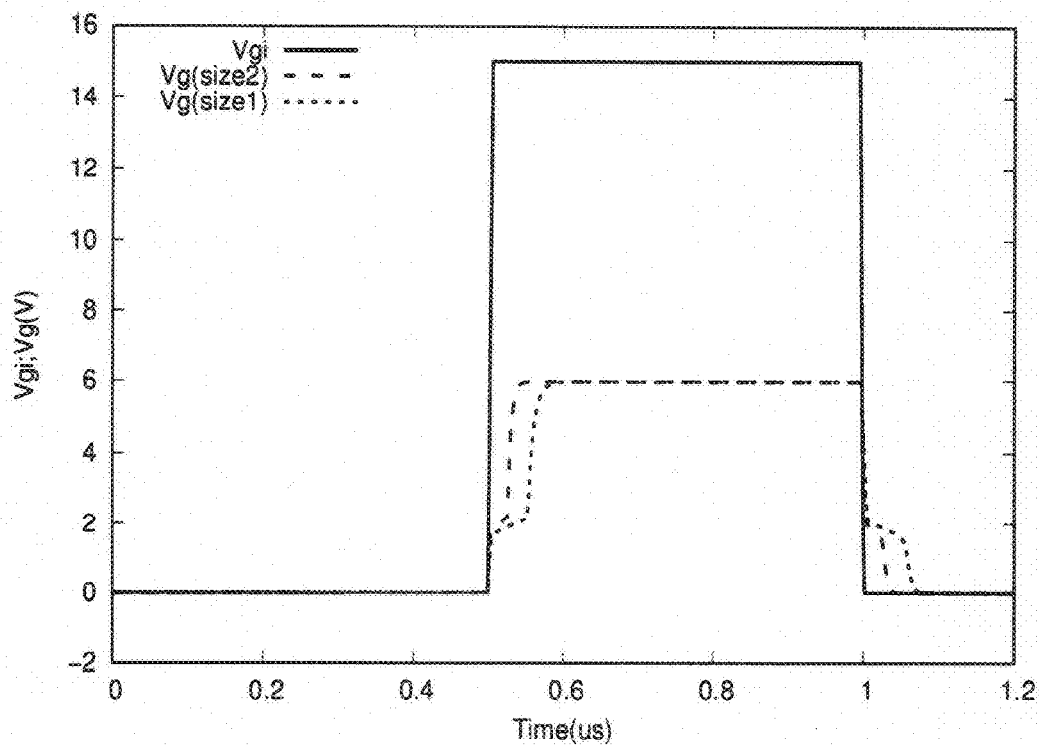
FIG. 13 is a plot showing pulsed voltage responses of two gate driver modules with different DHEMT gate widths (size1: DHEMT width=75 µm; size2: DHEMT width=150 µm), obtained from a simulation.
Figure 14:
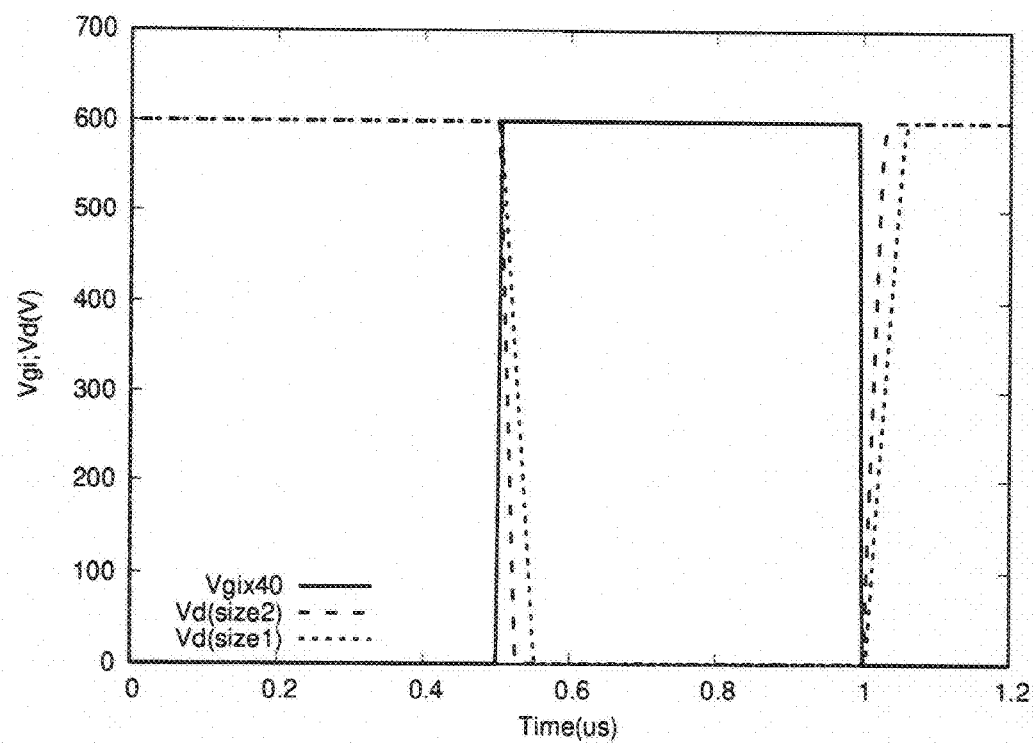
FIG. 14 is a plot showing a pulsed output response of a main EHEMT relative to an input driving pulse for two gate driver module designs, obtained from a simulation.

FIG. 13 shows the input/output pulse response of the gate driver module for the two channel sizes. The low resistance of the DHEMT results in a turn on/off with a clean edge and without a prolonged tail. As expected, the larger size gate driver module makes a faster switch. The clean turn on/off is also indicated in FIG. 14 which shows the power transistor output Vd pulse response relative to the gate driver module input voltage for the two channel sizes.

Figure 15:
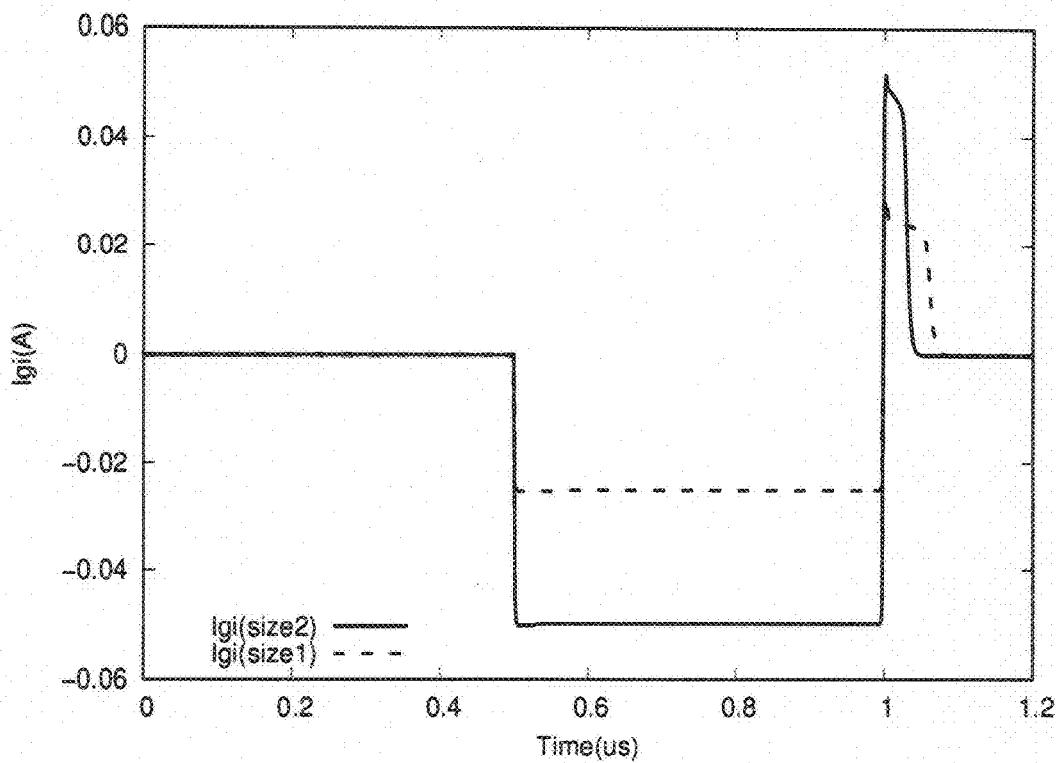
FIG. 15 is a plot showing pulsed current response of two gate driver modules with different gate widths, obtained from a simulation.

FIG. 15 shows the DC biasing current (thus power loss) of the gate driver module for the two channel sizes. It is clear that there is a trade off between DC power loss and the gate delay.

Figure 16:
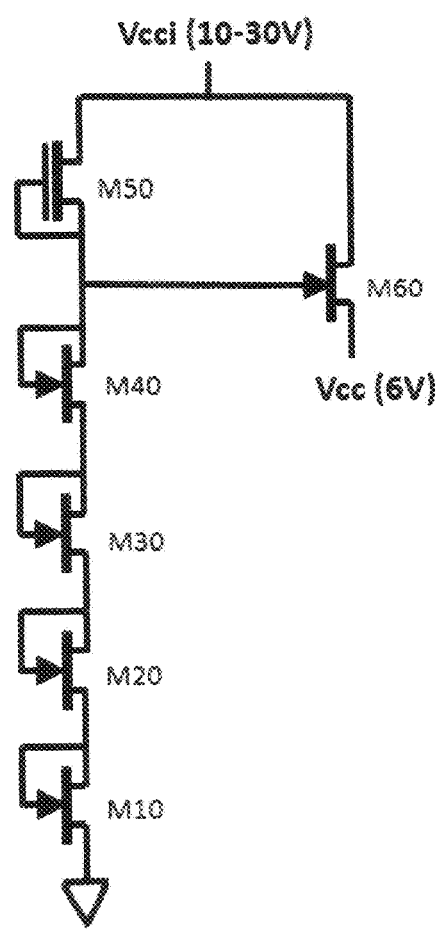
FIG. 16 is a schematic diagram of a gate driver circuit, according to another embodiment.

Another embodiment is shown in the schematic diagram of FIG. 16, where M60 is a low voltage (LV) EHEMT (such as, e.g., 40 V to 100 V) with a larger size channel and it supplies the current needed for a gate driver for a power HEMT, or for driving a device, circuit, etc. M10 to M40 are smaller LV EHEMTs with identical or similar channel sizes that have a connection shorting the gate with the drain. M50 is a DHEMT with a connection shorting the gate with its source. As will be discussed in detail below, M10 to M50 function to provide a reference voltage. The circuit may be referred to as a voltage regulator, or a voltage regulator module.

Figure 17:
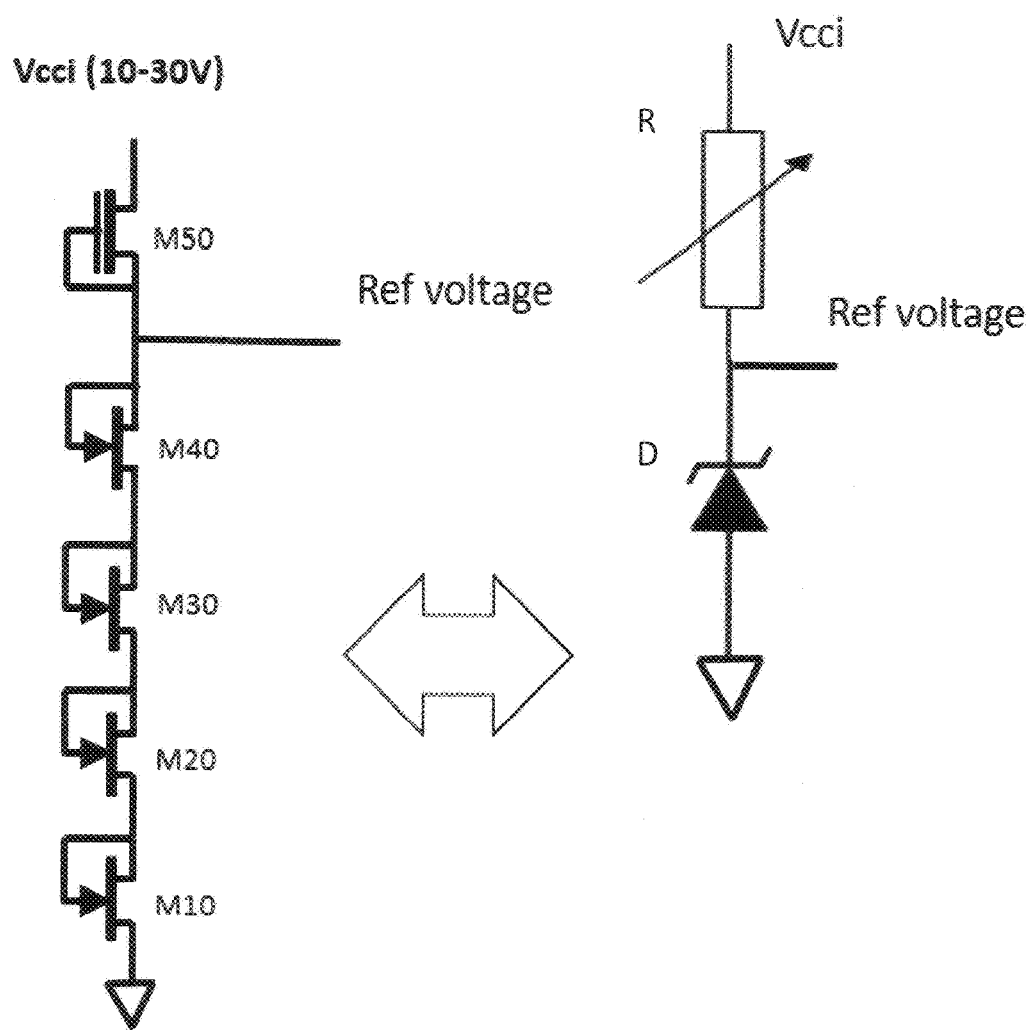
FIG. 17 is a schematic diagram showing an equivalent circuit of a voltage stabilizing circuit of the embodiment of FIG. 16.

The equivalent circuit of the embodiment of FIG. 16 is shown in FIG. 17, where the DHEMT M50 can be regarded as a variable resistor R while the four EHEMTs M10 to M40 can be regarded as a voltage stabilizing Zener diode which limits the reference voltage at about 7.5V.

The embodiment of FIG. 16 also achieves the advantages discussed above for the embodiment of FIG. 1, with respect to electron velocity characteristics (see FIG. 3B) and the variable resistance of the DHEMT, i.e., M50 in the embodiment of FIG. 16.

The benefit of using a DHEMT for M50 is also due to the low resistance at low field or low voltage. The high mobility (high initial slope in upper insert of FIG. 3B) takes the DHEMT quickly into the saturation regime where it acts as a variable resistor. For the same current flow, the voltage drop on the DHEMT can be varied so that any excess voltage from Vcci can be taken by the DHEMT M50, ensuring the reference voltage remains at 7.5 V so that current supplying the EHEMT source can be clamped at the required Vcc=6 V.

As in the embodiment of FIG. 1, the EHEMTs M10 to M40 of FIG. 16 are configured in a unique contact connection arrangement with gate-drain shortage, which effectively sets up a negative voltage feedback loop as described above.

As in the embodiment of FIG. 1, +Id is additive when more LV EHEMTs are used in series. Whereas it is desirable to use as many LV EHEMTs as possible for voltage stabilization purposes, the limit on the number of LV EHEMTs is set by the reference voltage which in this embodiment is about 7.5 V. Assuming a common threshold gate voltage (Vt) of about 1.5 V, and given that about 0.3-0.5 V above threshold voltage (Vt) is necessary to bias the LV EHEMTs in a proper signal amplification mode, only four LV EHEMTs can be used. However, should the Vt be lowered to 1 V or less, five to seven LV EHEMTs may be used.

The current supplying larger EHEMT M60 is connected in a way negative feedback can be used to stabilize the auxiliary power supply voltage Vcc. The negative feedback of M60 works as follows: consider a power supply load connected between ground and the source of M60. An increase in supply current in M60 would increase the voltage of the source of M60 and Vgs would be reduced. A reduced Vgs for M60 would increase the DC resistance of M60 and thus reverse the voltage increase of the source of M60. This completes the negative feedback loop. It is clear that effect of negative feedback is proportional to the transconductance of M60, which is proportional to the channel width/area of M60. A more stable Vcc requires a larger transistor size at higher cost of wafer area.

Figure 18:
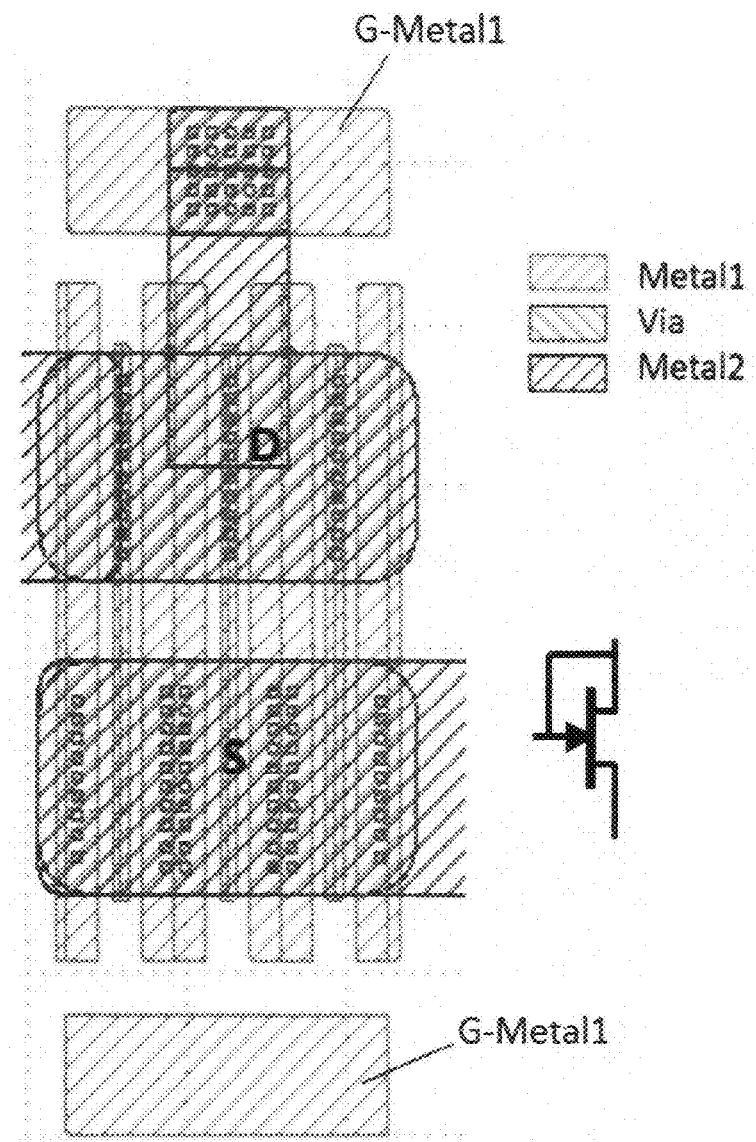
FIG. 18 is a diagram showing a layout of a gate-drain shorted EHEMT, according to one embodiment.

Implementation of the embodiment of FIG. 16 using GaN integrated circuit technology will now be described. The two metal-layer technology EHEMT layout of FIG. 4, and the DHEMT layout of FIG. 5 where the gate is shorted to the source, as described above, may be used in this embodiment. The voltage stabilizing EHEMTs M10 to M40 may be implemented using a Metal2 connection from drain to the top gate Metal1, as shown in FIG. 18. It is noted that the width ratio between LV DHEMT and LV EHEMT must be set carefully to achieve 7.5 V stabilized voltage, as described below.

Figure 23:
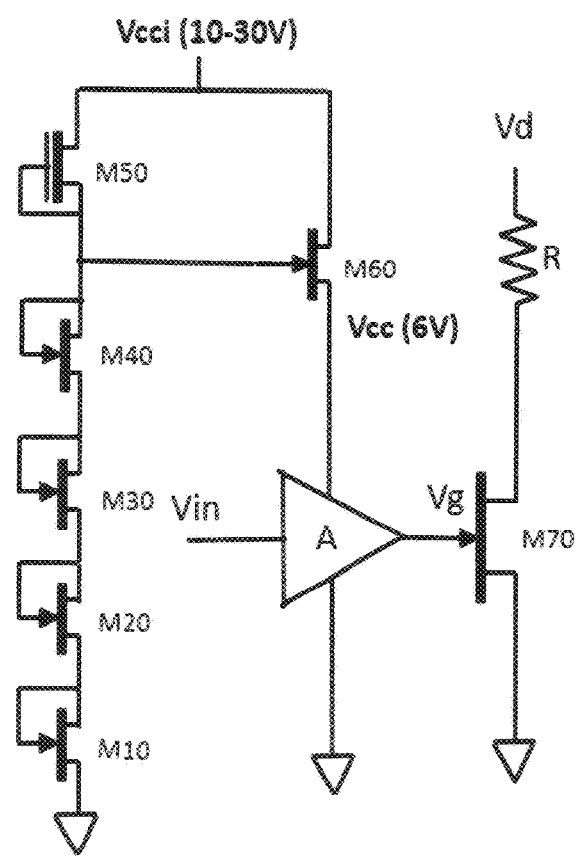
FIG. 23 is a schematic diagram showing how the regulator module may be used as an auxiliary power supply for a gate driver, according to one embodiment.

The layout of the regulator must be carefully planned. Firstly, it should be sufficiently small to make economic sense. Secondly, it should be placed on the edge of the whole module and not be in the way between the driver and the main power transistor. Thirdly, the power outlet Vcc should be on the top side to conveniently supply the whole driver circuit, which may include an amplifier as shown in the embodiment of FIG. 23.

Figure 19:
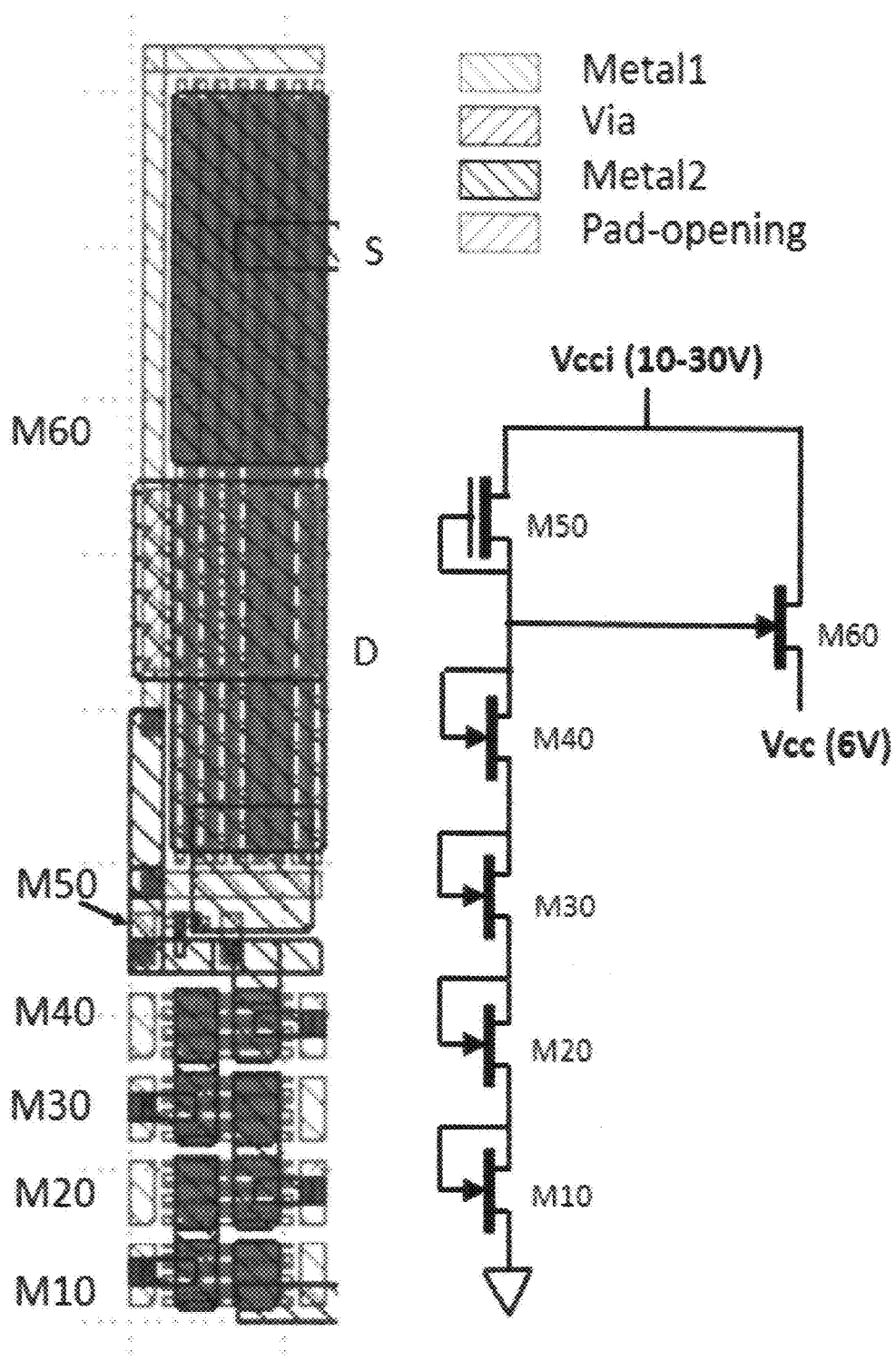
FIG. 19 is a diagram showing a layout of the regulator module of FIG. 16, according to an embodiment arranged in a rectangular block.
Figure 20:
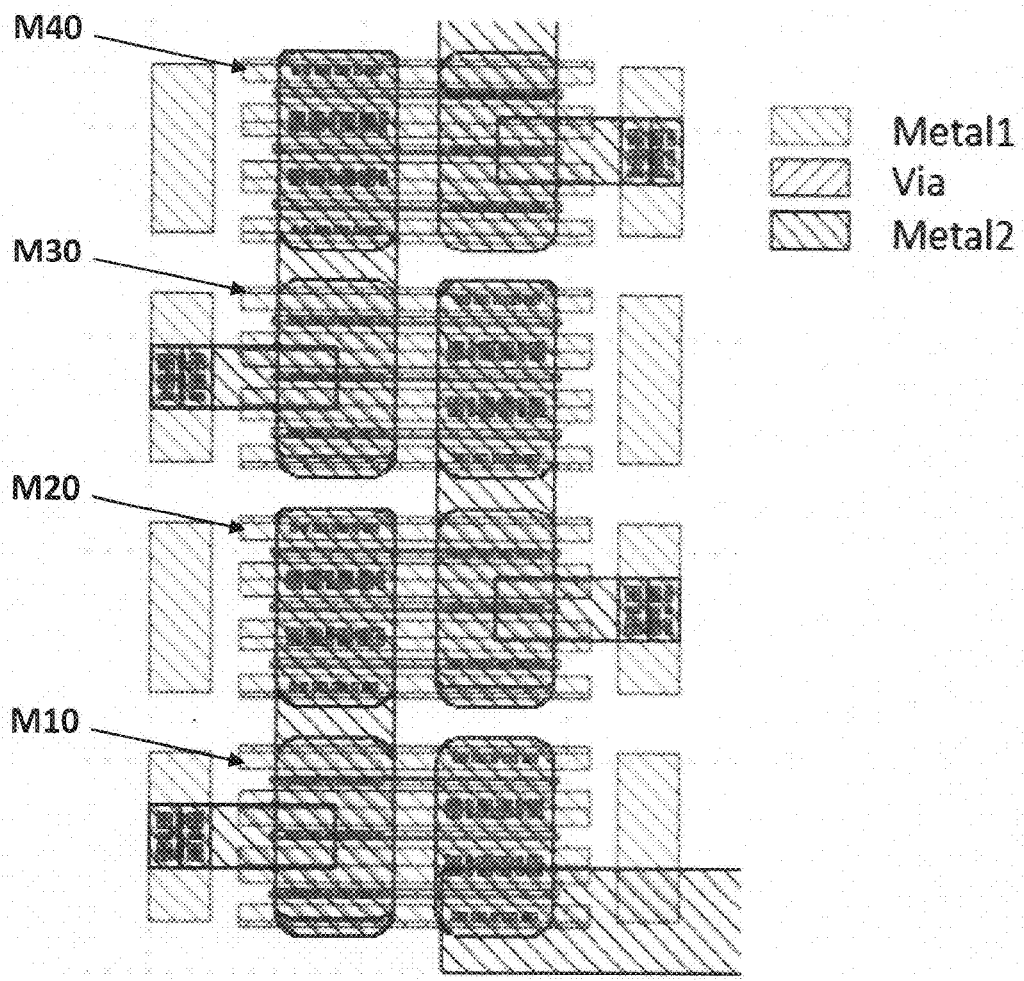
FIG. 20 is a detailed view of the layout of the four EHEMTs of the layout embodiment of FIG. 19.

FIG. 19 shows an embodiment of the regulator layout in a rectangular block. The EHEMTs M10 to M40 are placed at the lower end in the figure while the larger M60 is at the upper end. The power outlet is the source of M60 and this is located at the top of the die. It is noted that to make a constant x-size of the rectangular block, the four EHEMTs M10 to M40 have fingers oriented horizontal or perpendicular to those of the larger M60, as indicated in FIG. 20. With the source and drain electrodes arranged alternatively from M10 to M40, it is convenient to connect the drain of one HEMT to the source of the next using a short Metal2 rectangle.

Figure 21:
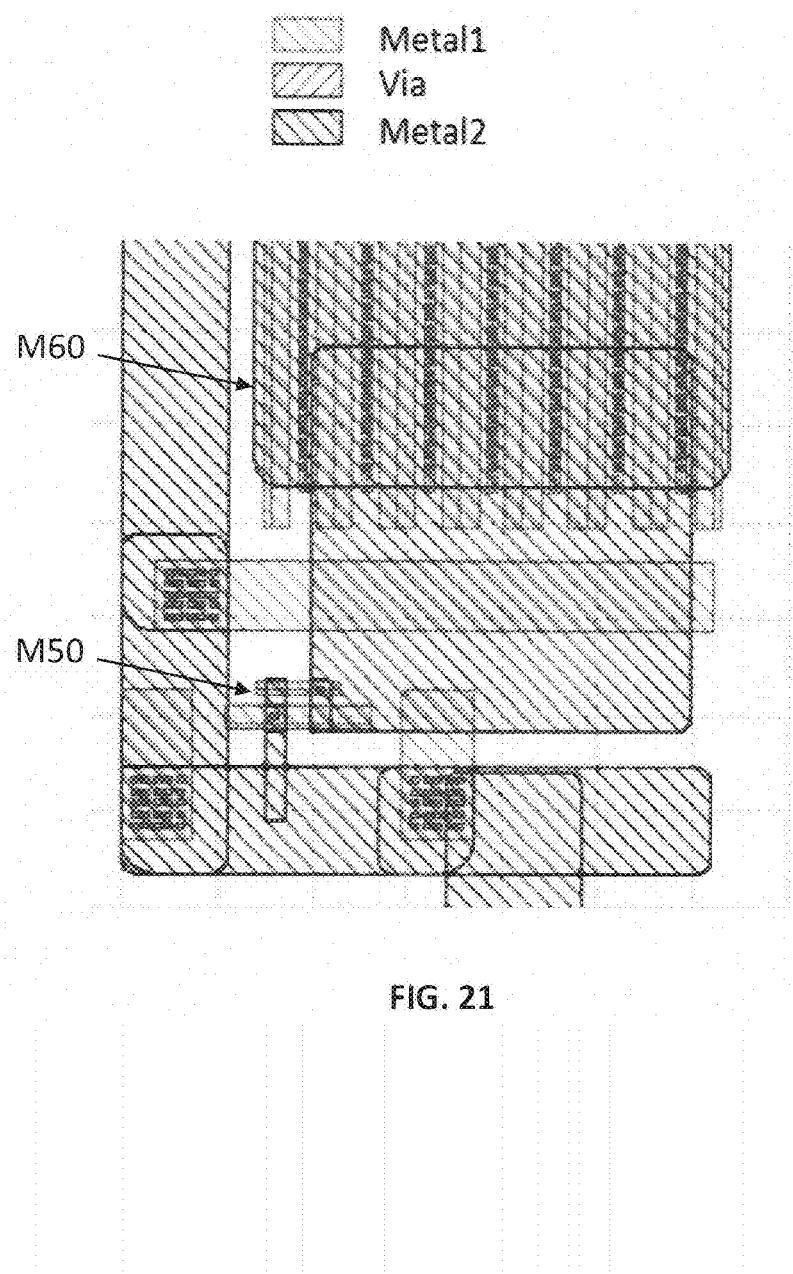
FIG. 21 is a detailed view of the layout of the DHEMT of the layout embodiment of FIG. 19.

Compared to the other transistors, the DHEMT M50 is relatively small, as can be seen in the layout embodiment of FIG. 19, and the more detailed view of FIG. 21. In one embodiment, the ratio of channel widths is such that the width of the DHEMT is about 2 to 20 percent, or about 2 to 10 percent, or about 3 to 5 percent of that of the EHEMTs (i.e., M10 to M40). If the channel widths of the EHEMTs are not equal but similar, the ratio should be based on the smallest EHEMT. To ensure that the gate of the DHEMT can be used as a common connector for the entire regulator without occupying a lot of area on the die, the fingers of the DHEMT are oriented perpendicular to those of the larger transistor M60, as shown in the embodiment of FIG. 21.

Figure 22A:
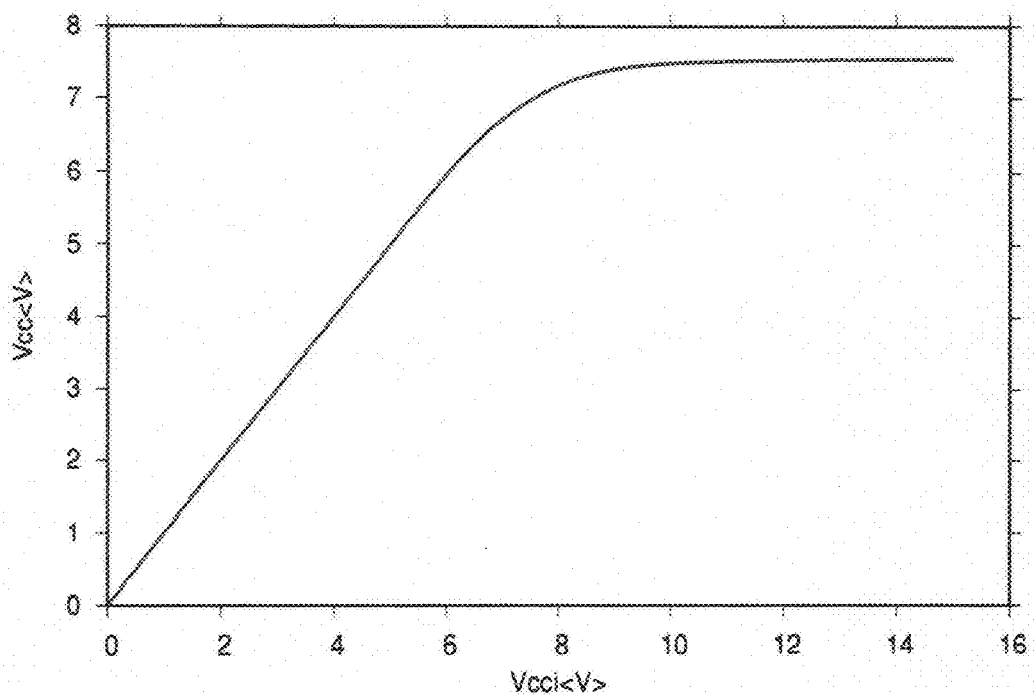
FIGS. 22A and 22B are plots of voltage transfer characteristics and current voltage characteristics of the voltage reference branch of the regulator module, respectively, obtained from a simulation.
Figure 22B:
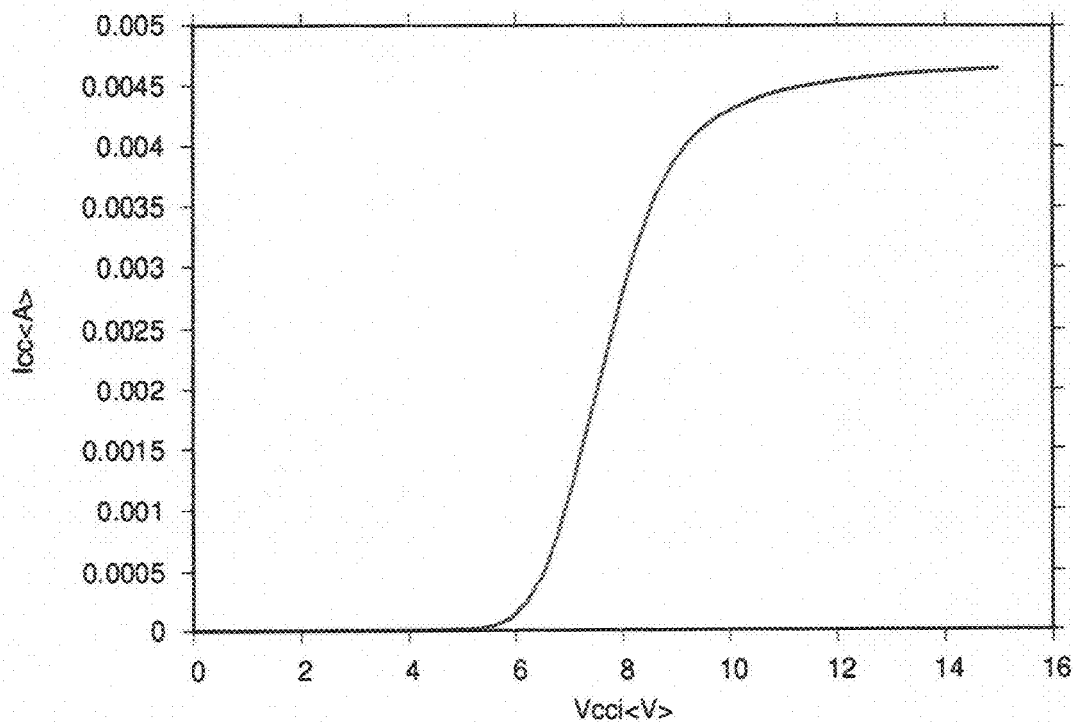

A simulation was conducted on the embodiment of FIG. 16 with the IC layout of FIG. 19, using APSYS™ software. FIG. 22A shows the simulated voltage transfer characteristics of the regulator IC and FIG. 22B shows the current-voltage characteristics of the voltage reference branch of the regulator. It is clear from FIG. 22A that the designed 7.5 V is achieved for a wide range above 8 V, validating the design. As a reference voltage provider, it is desirable that the DC current through the M10-M40 branch is small so that DC loss is minimal. This puts an upper limit to the sizes (channel widths) of M10 to M50. For example, for a 100 V LV embodiment, the EHEMT channel width is about 400 µm for each EHEMT.

FIG. 23 is a schematic diagram showing how the regulator may be used with an amplifier A, such as a direct-coupled FET logic (DCFL) amplifier, a buffer amplifier, etc., as an auxiliary power supply for gate driver for a main power transistor M70. In various embodiments the regulator, amplifier, and power transistor M70 may be implemented discretely, or they may be implemented monolithically integrated in GaN It is noted that regulating Vcci down to the required 6 V unavoidably causes power loss which is proportional to the input voltage Vcci and current supplied through transistor M60. Thus, embodiments may use a lower system voltage, that is, a voltage at the lower end of 10-30V, and the reference voltage branch M10 to M40 may be designed to draw a low DC current.

Figure 24:
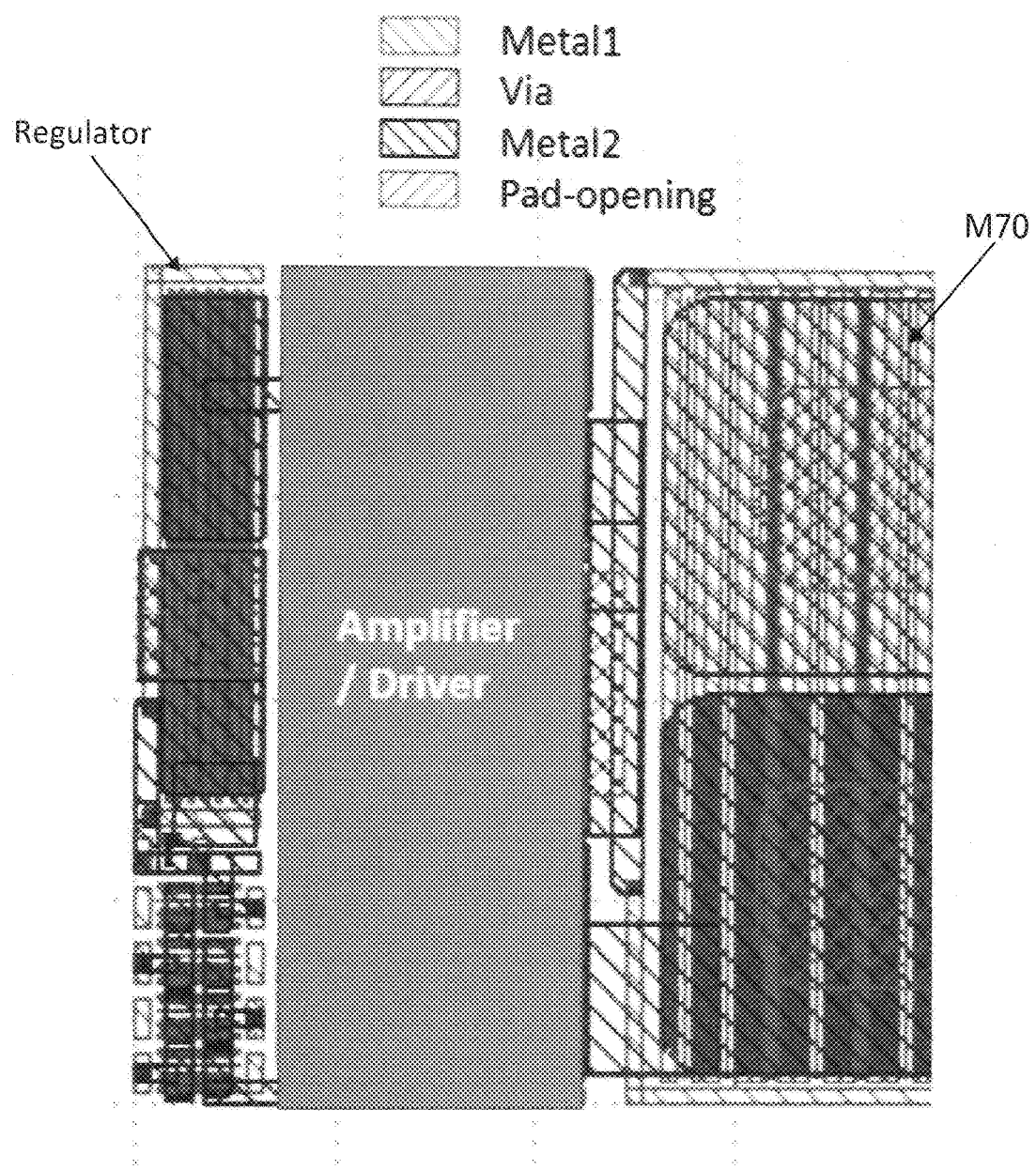
FIG. 24 is a diagram showing a layout of the auxiliary power supply of FIG. 23, according to an embodiment for driving a single power EHEMT.

FIG. 24 shows an embodiment of a die layout for the circuit of FIG. 23, including the regulator described above and shown in FIG. 19 in a power IC. The fingers of the main power HEMT M70 are parallel to the regulator longer direction, and the finger length of the main power HEMT is designed to be about the same as the longer side of the regulator block. The amplifier-driver block is designed to be about the same height as the regulator (as shown in FIG. 24) and it is sandwiched between the main power HEMT M70 and the regulator block.

Figure 25:
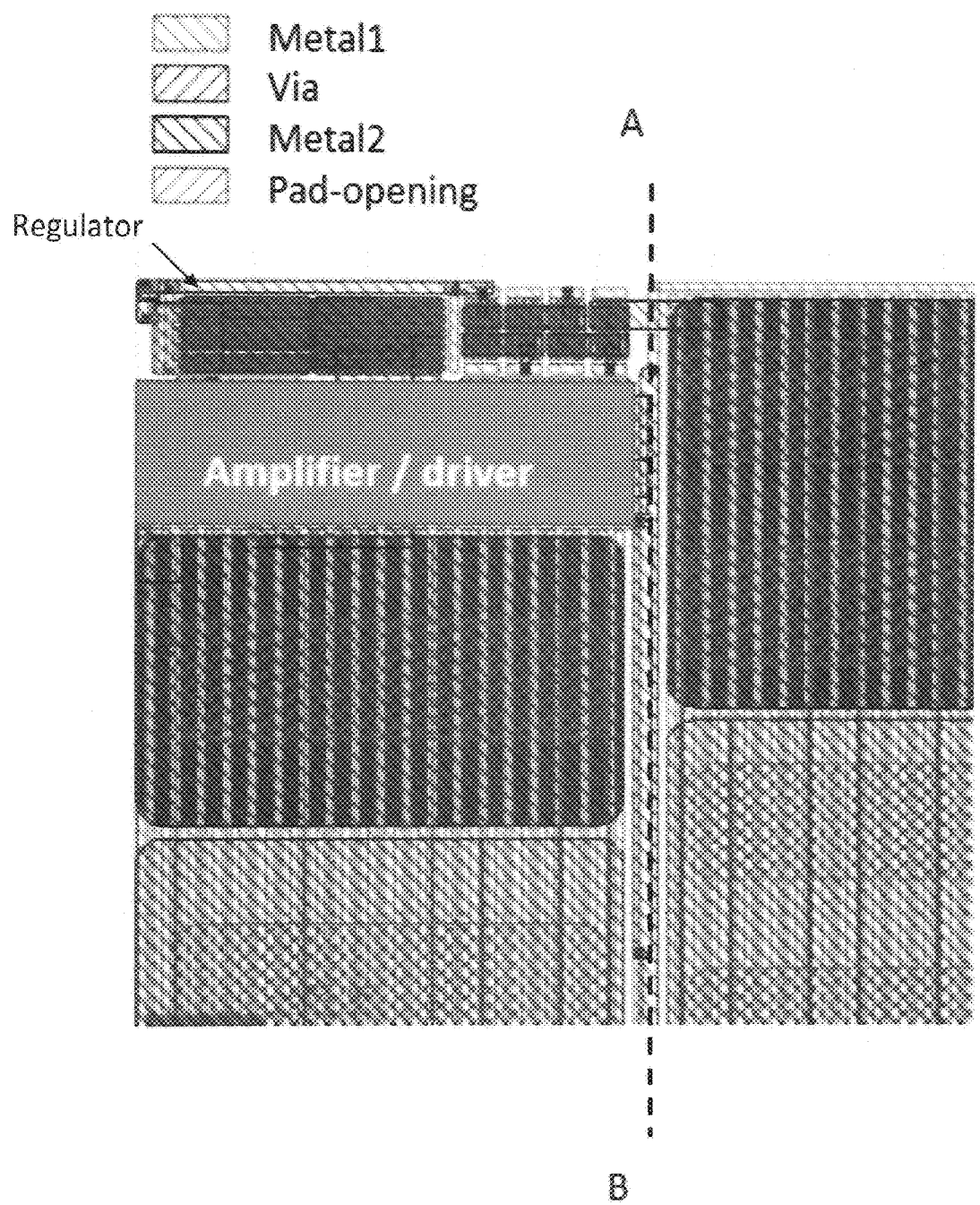
FIG. 25 is a diagram showing a layout of the auxiliary power supply of FIG. 23, according to an embodiment for driving two power EHEMTs in parallel.
Figure 26:
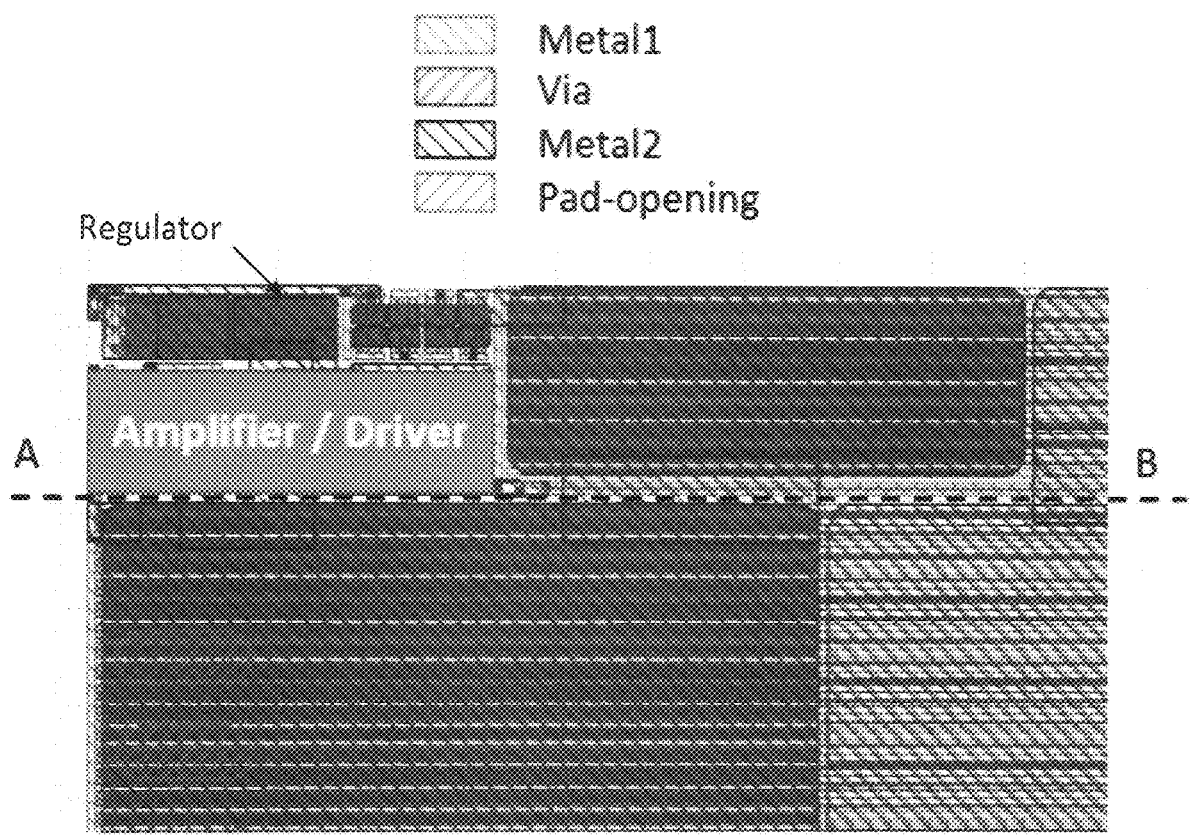
FIG. 26 is a diagram showing a layout of the auxiliary power supply of FIG. 23, according to another embodiment for driving two power EHEMTs in parallel.

FIGS. 25 and 26 show die layouts for two embodiments including the regulator as in FIG. 19, but with a main power HEMT with larger current rating. With such a large power HEMT it is not area-efficient to use the same arrangement as FIG. 24 since the regulator dimensions are much smaller than the main power HEMT. In the embodiment of FIG. 25 the regulator block is rotated 90 degrees relative to the main power HEMT where the gate fingers are vertically oriented. To provide area on the die for the regulator and the amplifier/driver block, the main power transistor is separated into two rectangular areas of paralleled EHEMT, leaving a rectangular area of the required size. Dashed line A-B separates the two rectangle-shaped main transistors connected in parallel. It is noted that the LV blocks (i.e., the regulator and amplifier) are located close to the source sides of the two main transistors in parallel.

As noted above, for LGA or BGA packaging on a 650 V application, it is necessary to separate the drain and source pads by a distance larger than 2 mm. Therefore, in one embodiment the layout of the main transistor is such that the gate fingers are parallel to the longer direction of the device while the source and drain are on the two ends of fingers. In another embodiment the gate fingers are oriented in the horizontal and longer direction, as shown in FIG. 26. In such an embodiment, for large current rating LGA devices, in order to reserve space for the LV blocks (i.e., the regulator and amplifier/driver), the two parallel rectangular power transistors are separated by the horizontal line A-B and LV blocks are above the larger main transistor.

Simulations were performed for the embodiment of FIG. 23 and layout according to FIG. 24 based on a power HEMT with 8 A rating.

Figure 27A:
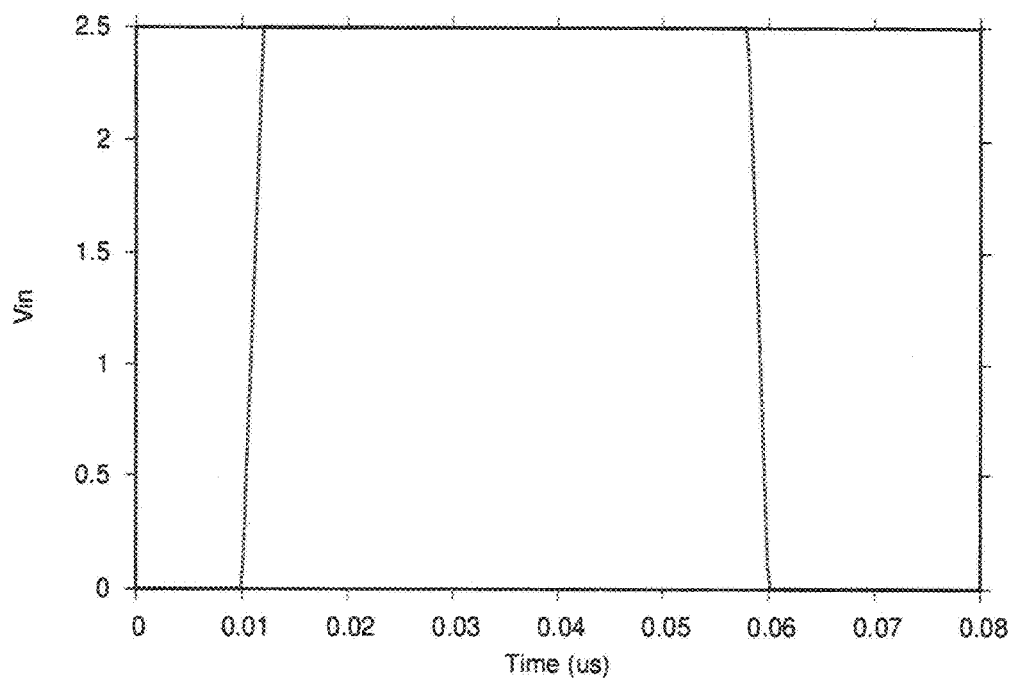
FIGS. 27A and 27B are plots showing input voltage pulse and auxiliary voltage output, respectively, obtained from a simulation of the embodiment of FIG. 23 and layout according to FIG. 24, for a main power EHEMT with nominal maximum current rating of 8 A.
Figure 27B:
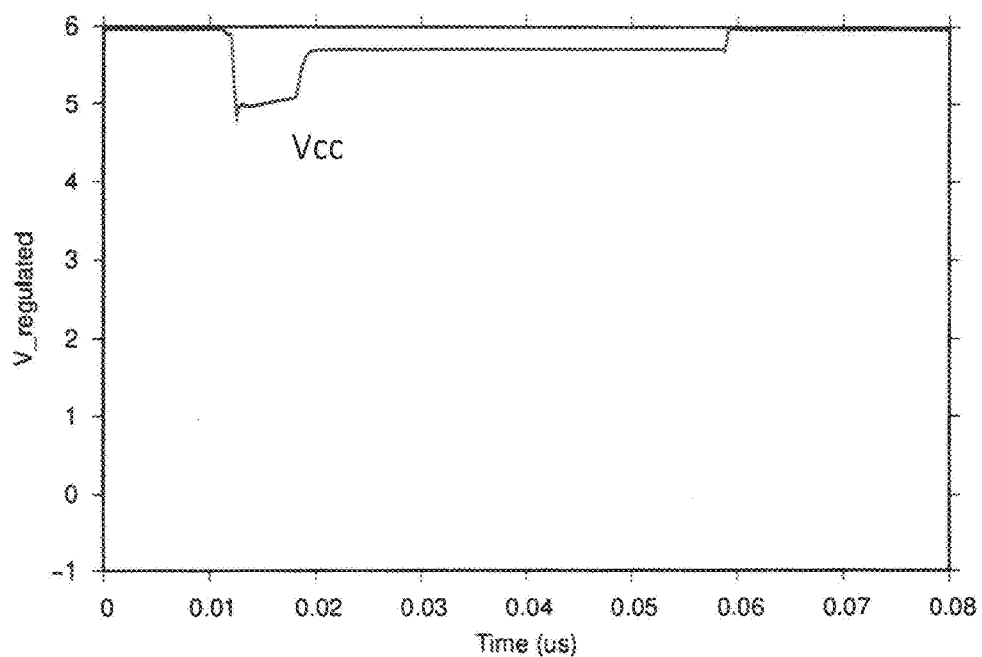

FIG. 27A shows the simulated input voltage pulse and FIG. 27B shows the auxiliary voltage supply output Vcc of about 5.5 V. External Vcci was set at 10 V. In this embodiment, the channel width of the current supplying transistor (M60) was set at 6000 µm. It can be seen that an acceptable voltage regulation was achieved, and it is expected that this can be improved using a larger M60 channel width, at the cost of more wafer area.

Figure 28A:
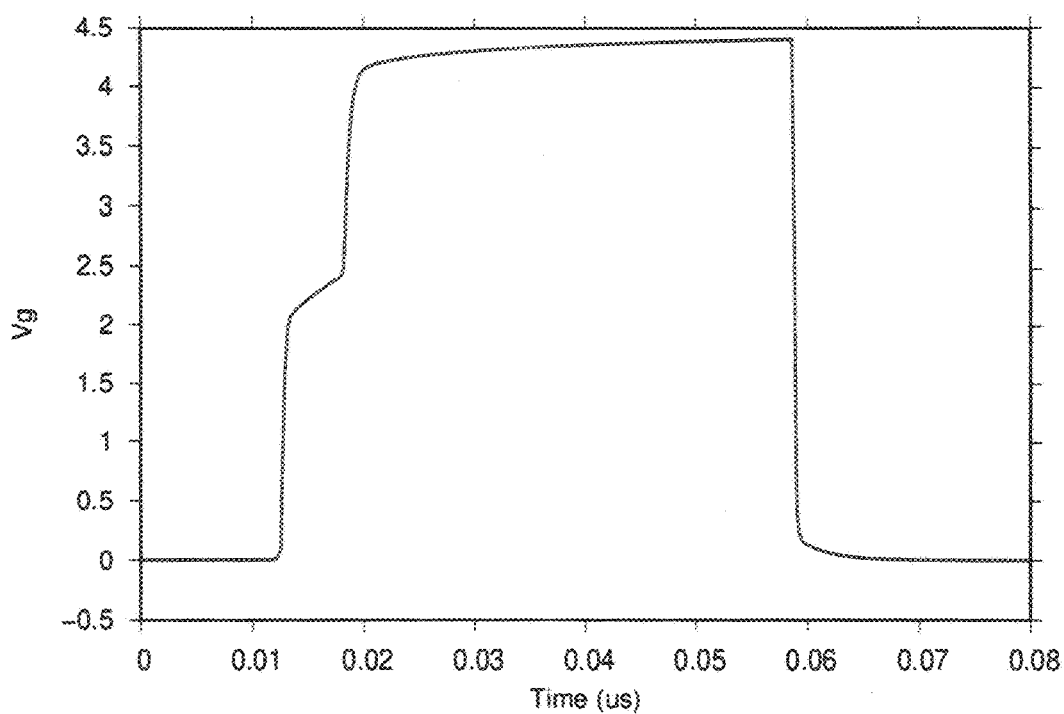
FIGS. 28A and 28B are plots showing gate driving voltage and gate current, respectively, obtained from a simulation of the embodiment of FIG. 23 and layout according to FIG. 24, for a main power EHEMT with nominal maximum current rating of 8 A.
Figure 28B:
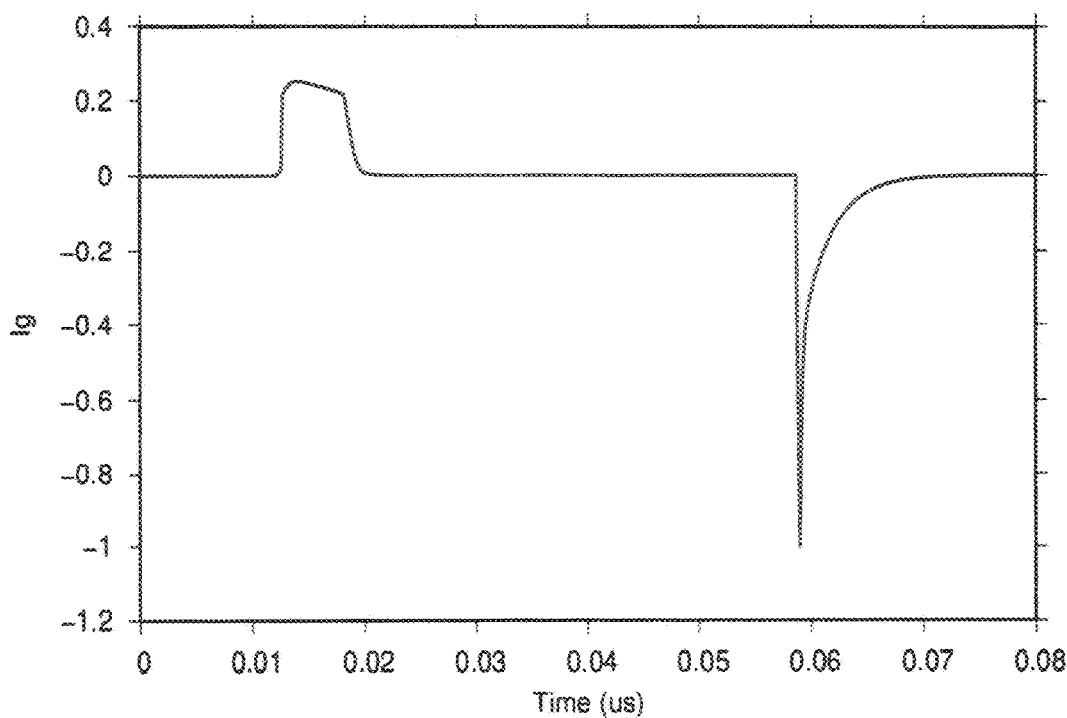

FIGS. 28A and 28B show the simulated gate driving voltage and gate current, respectively, for the main power EHEMT with nominal maximum current rating of 8 A. These results, together with the results shown in FIGS. 22A and 22B, confirm that the regulator achieves the objective of an auxiliary power supply capable of using a wide range of DC voltage input. Thus, the embodiments provide a small die-area voltage regulator suitable for supplying approximately 6 V auxiliary power to a GaN IC. The input voltage range is sufficiently large to be compatible with all current power system auxiliary power supplies. The embodiments make it possible to implement GaN power devices into existing power systems.

Figure 29A:
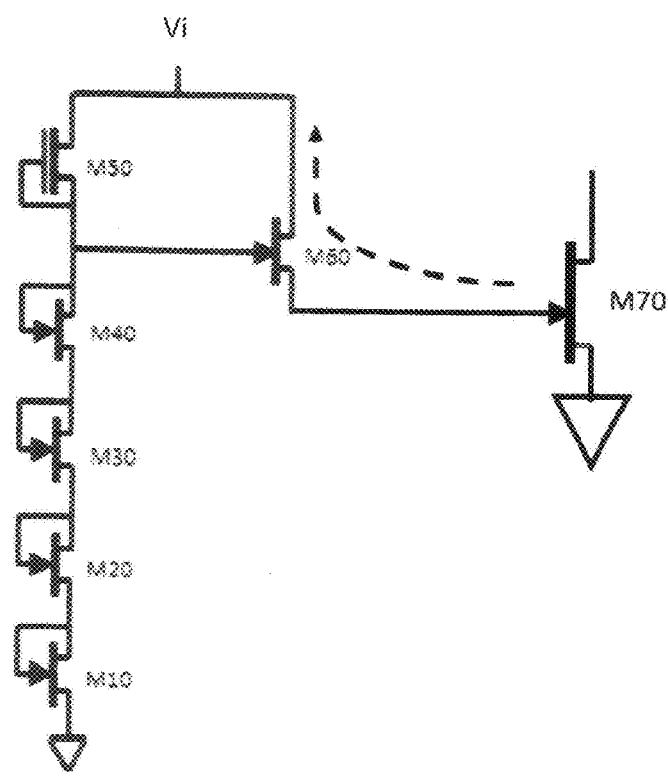
FIGS. 29A and 29B are schematic diagrams of gate driver circuits for a GaN power transistor, according to embodiments described herein.

In another embodiment a voltage regulator module such as that shown in FIG. 16 may be implemented as a gate driver in a source-follower configuration, wherein the source of the source follower amplifier is used to drive the gate of the main power transistor. Such an embodiment is shown in FIG. 29A, wherein the source of M60 drives the gate of the power HEMT M70. The dashed arrow shows the direction of the reverse recovery current. The reverse recovery current in the source follower amplifier may be designed to effectively discharge the gate current of the main power transistor M70.

Figure 29B:
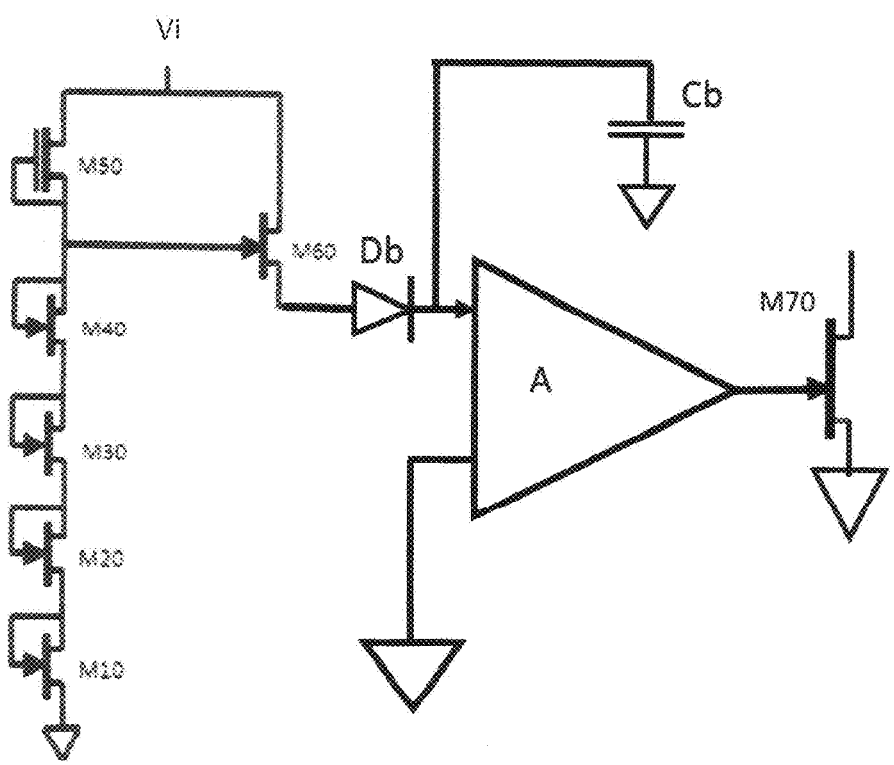

FIG. 29B shows an alternative embodiment implemented with an amplifier A to drive the gate of the power transistor M70. In this embodiment a bootstrap diode Db and capacitor Cb are used to maintain power to the amplifier for a short time during the discharge of the power transistor M70. This eliminates the need for an auxiliary power supply and serves as self-driven power switch. In the embodiments of FIGS. 29A and 29B, the source follower amplifier allows the circuits to achieve a self-driven condition.

Figure 30:
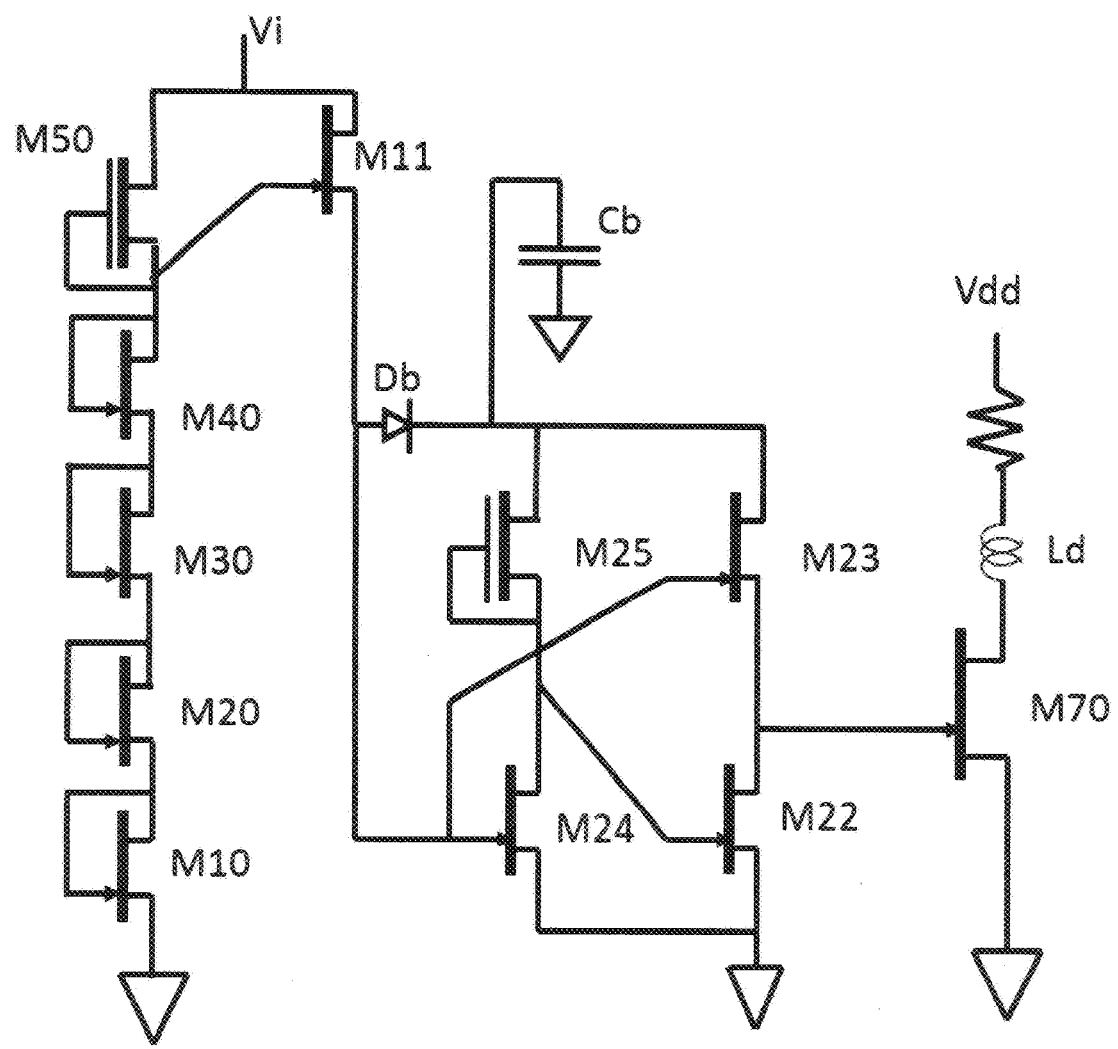
FIG. 30 is a schematic diagram of a gate driver circuit for a GaN power transistor, based on the embodiment of FIG. 29B.
Figure 31A:
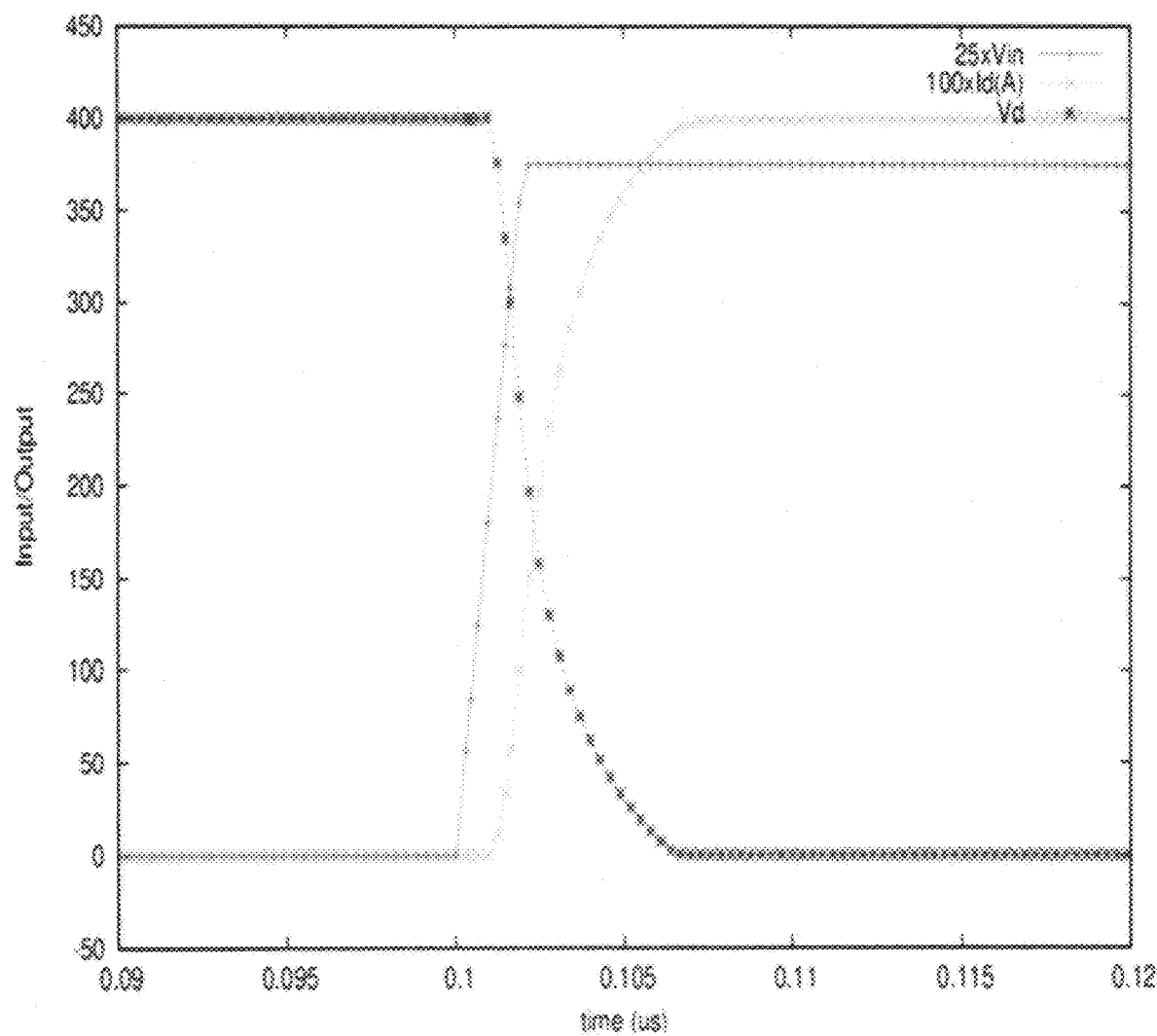
FIGS. 31A and 31B are plots showing performance of a gate driver based on the embodiment of FIG. 30, obtained from a simulation.
Figure 31B:
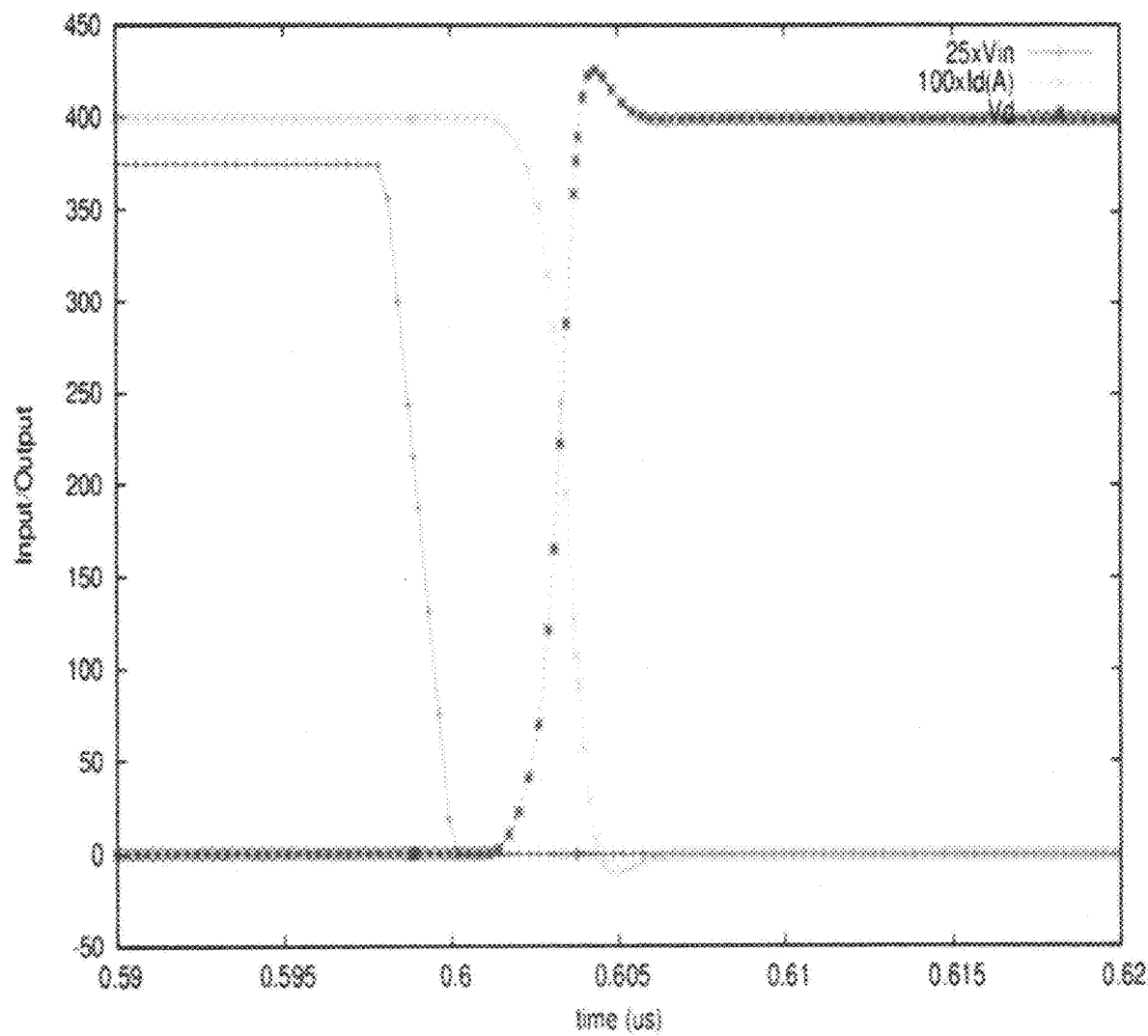

FIG. 30 shows an embodiment of the circuit of FIG. 29B implemented with a DCFL amplifier (M22, M23, M24, M25) to drive the power transistor M70. A simulation of this circuit was conducted using APSYS™ software, with Vdd=400 V and Rds=0.18 Ohm, and a 1 MHz PWM input signal of 15 V. FIGS. 31A and 31B show switching transition waveforms (turn-off and turn-on, respectively) with excellent performance and a fast switching time of about 5 ns.

The embodiments of FIGS. 29A and 29B and FIG. 30 may be used, for example, in place IGBT-based and MOSFET-based gate drivers in implementations with suitable driving voltages (e.g., 12-15 V) and sufficient driving current. The gate driver embodiments are self-driving, thereby eliminating the need to for auxiliary power supplies. This results in significant savings when upgrading from silicon power devices to GaN power devices. The embodiments may be implemented completely or partially in GaN integrated circuit technology using, for example, the techniques described above.

Figure 32:
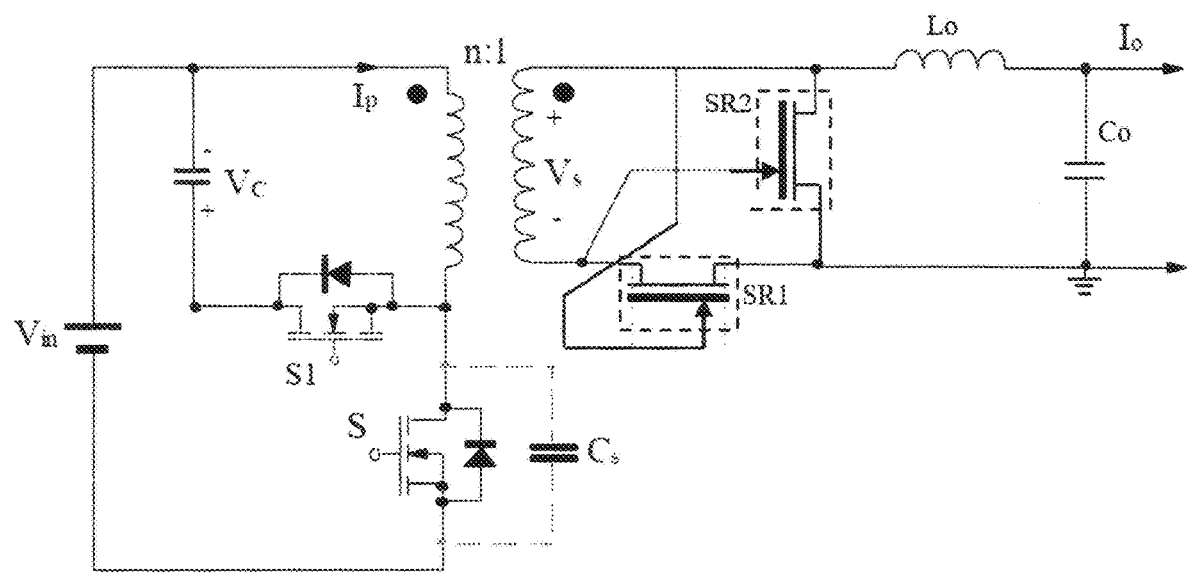
FIG. 32 is a schematic diagram showing an application of a gate driver as described herein as self-driven switches for synchronous rectification in an active clamped converter.

FIG. 32 shows an application of a self-driven GaN power switch such as the embodiments of FIG. 29A, 29B, or 30. In FIG. 32, the synchronous rectifiers SR1, SR2 of an active clamped converter are each implemented with a such a self-driven GaN power switch. The load side of the converter has a voltage that is usually higher than approximately 6 V required by a GaN switch and the current in the load side is usually sufficiently large so that use of such a self-driven GaN power switch is suitable. Advantageously, use of a self-driven GaN power switch eliminates the need for an auxiliary power supply, which reduces the cost and size of the converter. In the embodiment of FIG. 32, the self-driven GaN power switches used for the synchronous rectifiers SR1, SR2 are shown enclosed with dashed lines, indicating that they may be implemented completely or partially as GaN integrated circuits. It will be appreciated that self-driven GaN power switches as described herein may be used in other converters that involve synchronous rectification, such as, for example, flyback converters and DC-DC converters.

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

The invention claimed is:

1. A gate driver circuit for a gallium nitride (GaN) power transistor, comprising:
    an input point that receives an input voltage and an output point that outputs an output voltage to drive the GaN power transistor;
    a series circuit comprising at least one GaN D-mode HEMT (DHEMT) with gate-to-source connection and at least first to fourth GaN E-mode HEMTs (EHEMTs) each with drain-to-gate connection;
    an output EHEMT having a drain connected to the input point and a source connected to the output point;
    wherein a drain of the DHEMT is connected to the input point and a source of the DHEMT is connected to a drain of the first EHEMT and to a gate of the output EHEMT;
    wherein a source of the first EHEMT is connected to a drain of the second EHEMT, a source of the second EHEMT is connected to a drain of the third EHEMT, a source of the third EHEMT is connected to a drain of the fourth EHEMT, and a source of the fourth EHEMT is connected to a circuit common.

2. The gate driver circuit of claim 1, wherein the output EHEMT comprises a source follower amplifier.

3. The gate driver circuit of claim 1, further comprising an amplifier;
    wherein the output point is connected to an input of the amplifier;
    wherein an output of the amplifier drives the GaN power transistor.

4. The gate driver circuit of claim 3, wherein the amplifier input comprises a bootstrap configuration.

5. The gate driver circuit of claim 4, wherein the bootstrap configuration includes a diode connected in series between the output point and the amplifier input, and a capacitor connected between the amplifier input and the circuit common.

6. The gate driver circuit of claim 3, wherein the amplifier comprises a direct coupled FET logic (DCFL) amplifier.

7. The gate driver circuit of claim 1, comprising a GaN power transistor;
    wherein the GaN power transistor is self-driven.

8. The gate driver circuit of claim 3, comprising a GaN power transistor;
    wherein the GaN power transistor is self-driven.

9. The gate driver circuit of claim 1, implemented in GaN integrated circuit technology.

10. The gate driver circuit of claim 3, implemented in GaN integrated circuit technology.

11. A power converter comprising one or more GaN power switches;
    wherein at least one GaN power switch comprises the gate driver circuit of claim 1.

12. The power converter of claim 11, wherein the GaN power switch is a synchronous rectifier of the power converter.

13. A method for a gate driver for a gallium nitride (GaN) power transistor, comprising:
    providing an input point that receives an input voltage and an output point that outputs an output voltage to drive the GaN power transistor;
    connecting a series circuit comprising at least one GaN D-mode HEMT (DHEMT) with gate-to-source connection and at least first to fourth GaN E-mode HEMTs (EHEMTs) each with drain-to-gate connection;
    connecting an output EHEMT having a drain connected to the input point and a source connected to the output point;
    wherein a drain of the DHEMT is connected to the input point and a source of the DHEMT is connected to a drain of the first EHEMT and to a gate of the output EHEMT;
    wherein a source of the first EHEMT is connected to a drain of the second EHEMT, a source of the second EHEMT is connected to a drain of the third EHEMT, a source of the third EHEMT is connected to a drain of the fourth EHEMT, and a source of the fourth EHEMT is connected to a circuit common.

14. The method of claim 13, wherein the output EHEMT comprises a source follower amplifier.

15. The method of claim 13, further comprising connecting the output point to an input of an amplifier;
    wherein an output of the amplifier drives the GaN power transistor.

16. The method of claim 13, wherein the GaN power transistor is self-driven.

17. The method of claim 13, comprising implementing the gate driver using GaN integrated circuit technology.

18. The method of claim 15, comprising implementing the gate driver using GaN integrated circuit technology.

19. The method of claim 13, comprising driving a GaN power transistor of a converter circuit.

20. The method of claim 19, wherein the GaN power transistor is a synchronous rectifier of the converter circuit.

* * * * *